United States Patent
Fukami et al.

(10) Patent No.: US 11,945,917 B2
(45) Date of Patent: Apr. 2, 2024

(54) COMPOSITION, FILM, COLOR FILTER, SOLID-STATE IMAGING ELEMENT, IMAGE DISPLAY DEVICE, AND METHOD FOR PRODUCING COMPOUND

(71) Applicant: FUJIFILM Corporation, Tokyo (JP)

(72) Inventors: Yutaro Fukami, Haibara-gun (JP); Yushi Kaneko, Haibara-gun (JP); Junichi Ito, Haibara-gun (JP); Kazuya Ota, Haibara-gun (JP); Hiromu Koizumi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 967 days.

(21) Appl. No.: 16/897,540

(22) Filed: Jun. 10, 2020

(65) Prior Publication Data
US 2020/0299463 A1 Sep. 24, 2020

Related U.S. Application Data

(63) Continuation of application No. PCT/JP2018/040679, filed on Nov. 1, 2018.

(30) Foreign Application Priority Data

Dec. 27, 2017 (JP) ................. 2017-251262

(51) Int. Cl.
| | | |
|---|---|---|
| C08F 2/46 | (2006.01) | |
| C08F 2/50 | (2006.01) | |
| C08G 61/04 | (2006.01) | |
| C08G 63/08 | (2006.01) | |
| C08G 63/91 | (2006.01) | |
| C08G 64/18 | (2006.01) | |
| C08G 81/02 | (2006.01) | |
| C08K 5/00 | (2006.01) | |
| C08K 5/3437 | (2006.01) | |
| C08K 5/3447 | (2006.01) | |
| C08K 5/55 | (2006.01) | |
| C08L 81/02 | (2006.01) | |
| G02F 1/1335 | (2006.01) | |
| H01L 27/146 | (2006.01) | |

(52) U.S. Cl.
CPC .......... C08G 81/027 (2013.01); C08G 63/08 (2013.01); C08G 63/912 (2013.01); C08G 64/18 (2013.01); C08K 5/0041 (2013.01); C08K 5/3437 (2013.01); C08K 5/3447 (2013.01); C08K 5/55 (2013.01); C08L 81/02 (2013.01); G02F 1/133514 (2013.01); H01L 27/14621 (2013.01)

(58) Field of Classification Search
CPC ........ C08F 2/46; C08F 287/00; C08G 63/912; C08G 63/08; C08G 81/027; C08G 64/18; C08G 85/00; H01L 27/14621; G02F 1/133514; G03F 7/004; G03F 7/035; G03F 7/031; G03F 7/032; C08K 5/0041; C08K 5/55; C08K 5/3477; C08K 5/3437; C08L 81/02; G02B 5/20
USPC .................. 522/135, 134, 1; 520/1
See application file for complete search history.

(56) References Cited

U.S. PATENT DOCUMENTS

| | | |
|---|---|---|
| 2013/0237629 A1 | 9/2013 | Doi et al. |
| 2014/0163148 A1 | 6/2014 | Aoshima et al. |
| 2019/0243039 A1* | 8/2019 | Takishita ................. G02B 5/20 |

FOREIGN PATENT DOCUMENTS

| | | | |
|---|---|---|---|
| JP | 2009132782 | * | 6/2009 |
| JP | 2010-084036 A | | 4/2010 |
| JP | 2013-043962 A | | 3/2013 |
| WO | 2012/070382 A1 | | 5/2012 |
| WO | 2016/052069 A1 | | 4/2016 |

OTHER PUBLICATIONS

Arioka, JP 2009/132782 Machine Translation, Jun. 18, 2009 (Year: 2009).*
International Search Report dated Jan. 22, 2019 from the International Searching Authority in International Application No. PCT/JP2018/040679.
International Preliminary Report on Patentability dated Jun. 30, 2020 from the International Bureau in International Application No. PCT/JP2018/040679.
Written Opinion dated Jan. 22, 2019 from the International Bureau in International Application No. PCT/JP2018/040679.

* cited by examiner

*Primary Examiner* — Jessica Whiteley
(74) *Attorney, Agent, or Firm* — Sughrue Mion, PLLC

(57) ABSTRACT

A composition includes a compound represented by Formula (1) and a pigment. In Formula (1), $R^1$ represents an (m+n)-valent linking group, $P^1$ represents a polymer chain which has a polyester repeating unit in a main chain, and of which a weight-average molecular weight is 1000 or more, $P^2$ represents a polymer chain which is different from $P^1$ and has a repeating unit derived from a monomer having an ethylenically unsaturated bonding group in a main chain, m represents a number of 1 to 9, n represents a number of 1 to 9, and m+n satisfies 4 to 18.

$$(P^1)_m\text{---}R^1\text{---}(P^2)_n \tag{1}$$

27 Claims, 1 Drawing Sheet

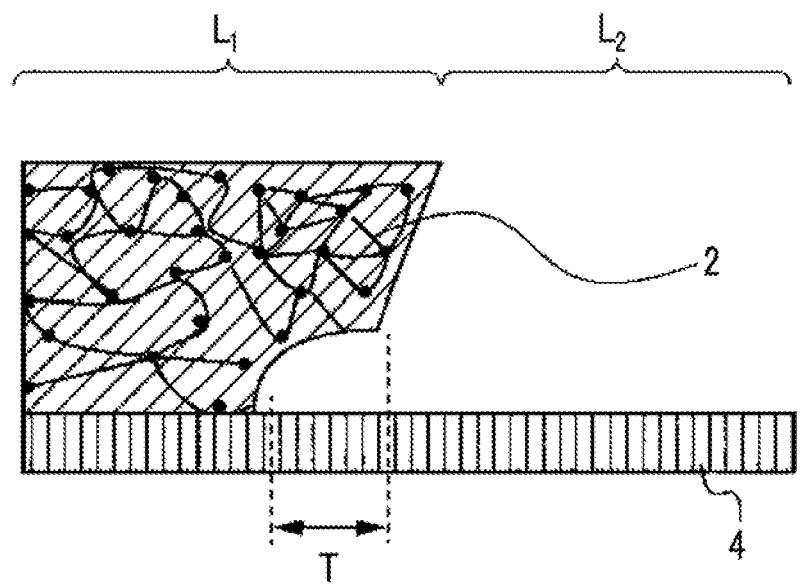

COMPOSITION, FILM, COLOR FILTER, SOLID-STATE IMAGING ELEMENT, IMAGE DISPLAY DEVICE, AND METHOD FOR PRODUCING COMPOUND

CROSS-REFERENCE TO RELATED APPLICATIONS

This application is a Continuation of PCT International Application No. PCT/JP2018/040679 filed on Nov. 1, 2018, which claims priority under 35 U.S.C § 119(a) to Japanese Patent Application No. 2017-251262 filed on Dec. 27, 2017. Each of the above application(s) is hereby expressly incorporated by reference, in its entirety, into the present application.

BACKGROUND OF THE INVENTION

1. Field of the Invention

The present invention relates to a composition including a pigment. In addition, the present invention further relates to a film using the composition, a color filter, a solid-state imaging element, an image display device, and a method for producing a compound.

2. Description of the Related Art

A film such as a color filter is produced using a composition including a pigment and a resin. In addition, in the composition including a pigment, the pigment is generally dispersed in the composition using a dispersant or the like. As the dispersant, for example, hyperbranched resins such as a graft resin and a resin (for example, a star polymer, a dendrimer, or the like) having a structure in which a plurality of polymer chains are bonded to a core, and the like have been used (refer to JP2010-084036A and JP2013-043962A).

SUMMARY OF THE INVENTION

In recent years, studies have been made to a reduction in film thickness and the like of a film including a pigment. In order to reduce the film thickness while maintaining target spectral characteristics, it has been studied to increase a pigment concentration in the film using a composition having high pigment concentration in the total solid content. However, in a case of increasing the pigment concentration in the total solid content of the composition, since the blending amount of components other than the pigment, such as a dispersant, is needed to be reduced, dispersion stability of the pigment tends to easily decrease. For this reason, in recent years, further improvement in the dispersion stability of the pigment in the composition has been desired.

Therefore, an object of the present invention is to provide a composition having excellent dispersion stability of a pigment. In addition, another object of the present invention is to provide a film, a color filter, a solid-state imaging element, an image display device, and a method for producing a compound.

As a result of intensive studies, the present inventors have found that the above object can be achieved by using a compound represented by Formula (1) described later, thereby leading to completion of the present invention. The present invention provides the following aspects.

<1> A composition comprising:
a compound represented by Formula (1); and
a pigment,

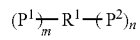
(1)

in Formula (1), $R^1$ represents an (m+n)-valent linking group,
$P^1$ represents a polymer chain which has, in a main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more,
$P^2$ represents a polymer chain which is different from $P^1$ and has a repeating unit derived from a monomer having an ethylenically unsaturated bonding group in a main chain,
m represents a number of 1 to 9, n represents a number of 1 to 9, and m+n satisfies 4 to 18,
in a case where m is 2 or more, m $P^1$'s may be the same as or different from each other, and
in a case where n is 2 or more, n $P^2$'s may be the same as or different from each other.

<2> The composition according to <1>, in which $R^1$ is a linking group derived from a polyfunctional thiol.

<3> The composition according to <1>, in which the compound represented by Formula (1) is a compound represented by Formula (2),

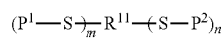
(2)

in Formula (2), $R^{11}$ represents an (m+n)-valent linking group, in Formula (2), $R^{11}$ represents an (m+n)-valent linking group,
$P^1$ represents a polymer chain which has, in a main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more,
$P^2$ represents a polymer chain which is different from $P^1$ and has a repeating unit derived from a monomer having an ethylenically unsaturated bonding group in a main chain,
S represents a sulfur atom,
m represents a number of 1 to 9, n represents a number of 1 to 9, and m+n satisfies 4 to 18,
in a case where m is 2 or more, m $P^1$'s may be the same as or different from each other, and
in a case where n is 2 or more, n $P^2$'s may be the same as or different from each other.

<4> The composition according to any one of <1> to <3>, in which the weight-average molecular weight of the polymer chain represented by $P^1$ is 1000 to 10000.

<5> The composition according to any one of <1> to <4>, in which the polymer chain represented by $P^1$ is represented by Formula (P1-1),

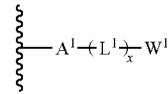
(P1-1)

in the formula, $A^1$ represents a single bond or a divalent linking group, $L^1$ represents a polyether repeating unit, a polyester repeating unit, a polyamide repeating unit, a polyimide repeating unit, a polyimine repeating unit, or a polyurethane repeating unit, x represents a number of 2 or more, $W^1$ represents a hydrogen atom or a substituent, and a wavy line represents a linking hand.

<6> The composition according to any one of <1> to <5>,
in which the polymer chain represented by $P^1$ includes a polyester repeating unit in the main chain.

<7> The composition according to <6>,
in which the polyester repeating unit includes a repeating unit derived from a lactone compound.

<8> The composition according to any one of <1> to <7>,
in which the polymer chain represented by $P^1$ has a repeating unit represented by Formula (G-1), Formula (G-2), or Formula (G-3) in the main chain,

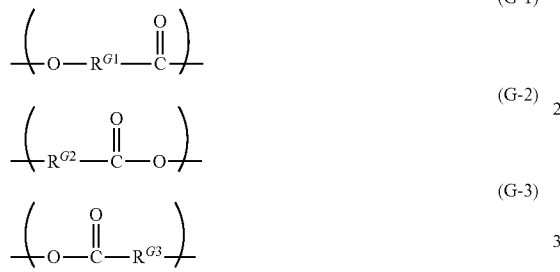

in the formulae, $R^{G}1$ to $R^{G3}$ respectively represent an alkylene group.

<9> The composition according to any one of <1> to <8>,
in which the polymer chain represented by $P^1$ is represented by Formula (P1-1), Formula (P1-12), or Formula (P1-13),

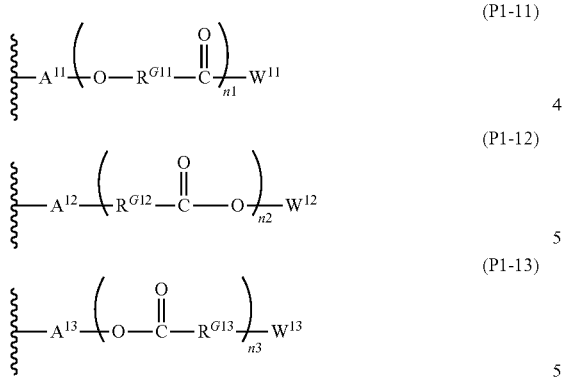

in the formulae, $A^{11}$ to $A^{13}$ respectively represent a single bond or a divalent linking group, $R^G 11$ to $R^{G13}$ respectively represent an alkylene group, n1 to n3 respectively represent a number of 2 or more, $W^{11}$ to $W^{13}$ respectively represent a hydrogen atom or a substituent, and a wavy line represents a linking hand, n1 $R^G 11$ may be the same as or different from each other, n2 $R^{G12}$ may be the same as or different from each other, and n3 $R^{G13}$ may be the same as or different from each other.

<10> The composition according to any one of <1> to <9>,
in which a molecular weight of the repeating unit derived from a monomer having an ethylenically unsaturated bonding group in the polymer chain represented by $P^2$ is 1000 or less.

<11> The composition according to any one of <1> to <10>,
in which the polymer chain represented by $P^2$ includes an acid group.

<12> The composition according to any one of <1> to <11>,
in which the polymer chain represented by $P^2$ includes an ethylenically unsaturated bonding group.

<13> The composition according to any one of <1> to <12>,
in which the repeating unit derived from a monomer having an ethylenically unsaturated bonding group in the polymer chain represented by $P^2$ is a repeating unit including a partial structure represented by Formula (P2-1),

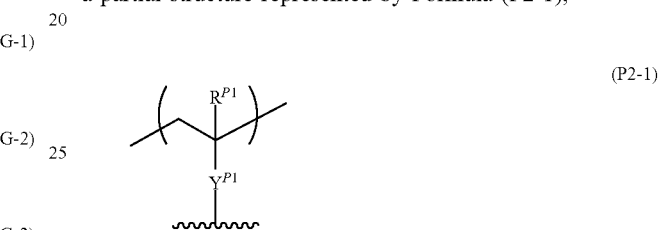

in the formula, $R^{P1}$ represents a hydrogen atom or an alkyl group, $Y^{P1}$ represents a single bond, an aryl group, —COO—, or —CONH—, and a wavy line represents a linking site.

<14> The composition according to any one of <1> to <13>,
in which a weight-average molecular weight of the compound represented by Formula (1) is 4000 to 30000.

<15> The composition according to any one of <1> to <14>,
in which a dispersity of the compound represented by Formula (1) is 1.0 to 3.0.

<16> The composition according to any one of <1> to <15>,
in which an acid value of the compound represented by Formula (1) is 25 to 200 mgKOH/g.

<17> The composition according to any one of <1> to <16>,
in which the pigment is an organic pigment.

<18> The composition according to any one of <1> to <17>,
in which the pigment has a maximum absorption wavelength in a wavelength range of 400 to 2000 nm.

<19> The composition according to any one of <1> to <18>,
in which the pigment has a maximum absorption wavelength in a wavelength range of 400 to 700 nm.

<20> The composition according to any one of <1> to <19>, further comprising: a polymerizable monomer.

<21> The composition according to any one of <1> to <20>, further comprising: a photopolymerization initiator.

<22> A film obtained from the composition according to any one of <1> to <21>.

<23> A color filter comprising the film according to <22>.

<24> A solid-state imaging element comprising the film according to <22>.

<25> An image display device comprising the film according to <22>.

<26> A method for producing a compound represented by Formula (1), the method comprising:

a step of reacting a polyfunctional thiol compound with a macromonomer which has at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more; and a step of polymerizing a monomer having an ethylenically unsaturated bonding group in the presence of a reaction product obtained in the step of reacting,

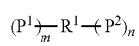 (1)

in Formula (1), $R^1$ represents an (m+n)-valent linking group, $P^1$ represents a polymer chain which has, in a main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more, $P^2$ represents a polymer chain which is different from $P^1$ and has a repeating unit derived from a monomer having an ethylenically unsaturated bonding group in a main chain, m represents a number of 1 to 9, n represents a number of 1 to 9, and m+n satisfies 4 to 18, in a case where m is 2 or more, m $P^1$'s may be the same as or different from each other, and in a case where n is 2 or more, n $P^2$'s may be the same as or different from each other.

According to the present invention, it is possible to provide a composition having excellent dispersion stability of a pigment. In addition, it is also possible to provide a film, a color filter, a solid-state imaging element, an image display device, and a method for producing a compound.

BRIEF DESCRIPTION OF THE DRAWINGS

FIG. 1 is an explanatory diagram illustrating a method for evaluating an undercut width.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright-line spectrum of a mercury lamp, far ultraviolet rays typified by an excimer laser, extreme ultraviolet rays (EUV light), X-rays, or electron beams.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, the term "step" not only means an independent step, but also includes a step which is not clearly distinguished from other steps in a case where an intended action of the step is obtained.

In the present specification, near-infrared rays refer to light (electromagnetic waves) having a wavelength of 700 to 2500 nm.

In the present specification, a pigment means a compound which is hardly soluble in a solvent. For example, as the pigment, both of the solubility in 100 g of water at 23° C. and 100 g of propylene glycol monomethyl ether acetate at 23° C. is preferably 0.1 g or less and more preferably 0.01 g or less.

In the present specification, a dye means a compound which is soluble in a solvent. For example, as the dye, at least one of the solubility selected from 100 g of water at 23° C. or 100 g of propylene glycol monomethyl ether acetate at 23° C. is preferably 1 g or more and more preferably 5 g or more.

In the present specification, a weight-average molecular weight (Mw) and a number-average molecular weight (Mn) are each defined as a value in terms of polystyrene through measurement by means of gel permeation chromatography (GPC).

<Composition>

The composition according to an embodiment of the present invention includes a compound (hereinafter, also referred to as a compound (1)) represented by Formula (1) and a pigment.

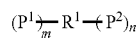 (1)

In Formula (1), $R^1$ represents an (m+n)-valent linking group, $P^1$ represents a polymer chain which has, in the main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more, $P^2$ represents a polymer chain which is different from $P^1$ and has a repeating unit derived from a monomer having an ethylenically unsaturated bonding group in the main chain, m represents a number of 1 to 9, n represents a number of 1 to 9, and m+n satisfies 4 to 18, in a case where m is 2 or more, m $P^1$'s may be the same as or different from each other, and in a case where n is 2 or more, n $P^2$'s may be the same as or different from each other.

In the composition according to the embodiment of the present invention, by using the above-described compound (1) and the pigment in combination, dispersion stability of the pigment in the composition is good and change over time in the viscosity of the composition can be suppressed. The compound (1) has a structure in which, through the (m+n)-valent linking group $R^1$, the polymer chain $P^1$ having, in the main chain, the predetermined repeating unit described above and the polymer chain P2 having, in the main chain, the repeating unit derived from a monomer having an ethylenically unsaturated bonding group are bonded in the total of 4 to 18. Since the compound (1) has such a structure, after adsorbing the compound (1) to the pigment, the steric repulsive force is easily exerted and the aggregation of the pigments in the composition can be more effectively suppressed. As a result, it is assumed that excellent dispersion stability is obtained. In addition, the compound (1) has a lower dispersity compared with a graft resin which is one of a hyperbranched resin, and tends to have a low viscosity of the compound itself. Therefore, the composition according to the embodiment of the present invention tends to have a low viscosity. Therefore, for example, in a case where a pattern is formed by a photolithography method using the composition according to the embodiment of the present invention, the curing reaction in a case of exposure can easily reach a deep portion of the film and excellent developability is easily obtained. In addition, in a case where the compound (1) has an acid group, more preferably in a case where the polymer chain $P^2$ has a repeating unit having an acid group, the solubility of the unexposed portion in a developer is increased and more excellent developability is easily obtained. Hereinafter, respective components included in the composition according to the embodiment of the present invention will be described.

<<Compound (1)>>

The composition according to the embodiment of the present invention includes the compound (compound (1)) represented by Formula (1).

The weight-average molecular weight of the compound (1) is preferably 3000 to 150000. The lower limit is preferably 4000 or more and more preferably 5000 or more. The upper limit is preferably 100000 or less, more preferably 50000 or less, and still more preferably 30000 or less. In a case where the weight-average molecular weight of the compound (1) is within the above-described range, dispersion stability of the pigment in the composition is good. In particular, in a case where the weight-average molecular weight of the compound (1) is in a range of 4000 to 30000, the dispersion stability of the pigment in the composition can be further improved.

The dispersity (weight-average molecular weight/number-average molecular weight) of the compound (1) is preferably 1.0 to 3.0. The upper limit is preferably less than 3.0, preferably 2.5 or less, and more preferably 2.0 or less. In a case where the dispersity of the compound (1) is within the above-described range, dispersion stability of the pigment in the composition is particularly good. Furthermore, the viscosity of the compound (1) itself is low, and a composition having low viscosity is easily obtained. The lower limit may be, for example, 1.1 or more, 1.2 or more, 1.3 or more, 1.4 or more, 1.5 or more, or 1.6 or more.

The compound (1) can have an acid group. In a case where the compound (1) has an acid group, developability of the composition can be further improved. Therefore, in a case of forming a pattern by the photolithography method, generation of development residue can be effectively suppressed. Examples of the acid group include a carboxyl group, a sulfo group, a phosphoric acid group, a monosulfate group, a monophosphate group, and a borate group. Among these, a carboxyl group, a sulfo group, a monosulfate group, a phosphoric acid group, or a monophosphate group is preferable, a carboxyl group, a sulfo group, or a phosphoric acid group is more preferable, a carboxyl group or a sulfo group is still more preferable, and a carboxyl group is particularly preferable. In a case where the compound (1) has an acid group, it is sufficient that the acid group is included in any of $R^1$, $P^1$, or $P^2$ in Formula (1), but from the viewpoint that both of the dispersion stability of the pigment in the composition and the developability is easily achieved at a high level, it is preferable that the acid group is included in $P^2$. In addition, in a case where the compound (1) has an acid group, the acid value of the compound (1) is preferably 200 mgKOH/g or less, more preferably 150 mgKOH/g or less, and still more preferably 120 mgKOH/g or less. The lower limit is preferably 5 mgKOH/g or more, more preferably 10 mgKOH/g or more, and still more preferably 25 mgKOH/g or more. In a case where the acid value of the compound (1) is 25 to 200 mgKOH/g, both of the dispersion stability of the pigment in the composition and the developability can be achieved at a high level.

The compound (1) can have an ethylenically unsaturated bonding group. In a case where the compound (1) has an ethylenically unsaturated bonding group, curability of the composition can be improved. Examples of the ethylenically unsaturated bonding group include a vinyl group, a styrene group, an allyl group, a methallyl group, and a (meth)acryloyl group, and a (meth)acryloyl group is preferable. In a case where the compound (1) has an ethylenically unsaturated bonding group, it is sufficient that the ethylenically unsaturated bonding group is included in any of $R^1$, $P^1$, or $P^2$ in Formula (1), but from the viewpoint that both of the dispersion stability of the pigment in the composition and the curability is easily achieved at a high level, it is preferable that the ethylenically unsaturated bonding group is included in $P^1$ or $P^2$, it is more preferable that the ethylenically unsaturated bonding group is included in $P^2$, and it is still more preferable that the ethylenically unsaturated bonding group is included in the side chain of $P^2$. In addition, in a case where the compound (1) has an ethylenically unsaturated bonding group, the C=C value of the compound (1) is preferably 0.1-1.5 mmol/g. The lower limit is preferably 0.2 mmol/g or more. The upper limit is preferably 1.0 mmol/g or less and more preferably 0.8 mmol/g or less. In a case where the C=C value of the compound (1) is within the above-described range, dispersion stability of the pigment in the composition and curability of the composition are good. The C=C value of the compound (1) is a numerical value representing a molar amount of the ethylenically unsaturated bonding group per 1 g of the solid content of the compound (1). In a case where the molar amount of the ethylenically unsaturated bonding group in the compound (1) can be calculated from a raw material used in the synthesis of the compound (1), the value calculated from the prepared raw material is used. In addition, with regard to the C=C value of the compound (1), in a case where the molar amount of the ethylenically unsaturated bonding group in the compound (1) cannot be calculated from a raw material used in the synthesis of the compound (1), a value measured using a hydrolysis method is used. Specifically, a low-molecular-weight component (a) of an ethylenically unsaturated bonding group site is extracted from the compound (1) by an alkali treatment, a content of the low-molecular-weight component is measured by high-performance liquid chromatography (HPLC), and the C=C value of the polymerizable resin can be calculated by the following formula. In addition, with regard to the C=C value of the compound (1), in a case where the molar amount of the ethylenically unsaturated bonding group in the compound (1) cannot be calculated from a raw material used in the synthesis of the compound (1) and the C=C value cannot be measured even though the hydrolysis method, a value measured using a nuclear magnetic resonance (NMR) method is used.

C=C Value [mmol/g] of Compound (1)=(Content [ppm] of Low-Molecular-Weight Component (a)/Molecular Weight [g/mol] of Low-Molecular-Weight Component (a)/(Weighed Value [g] of Compound (1))×(Concentration of Solid Contents [% by mass] of Compound (1)/100)× 10)

The reduced viscosity obtained by the following method for measuring the compound (1) is preferably 7.0 to 20.0 ml/g, more preferably 8.0 to 19.0 ml/g, and still more preferably 7.0 to 18.0 ml/g. In a case where the reduced viscosity of the compound (1) is within the above-described range, dispersion stability of the pigment in the composition is good, furthermore, developability and curability can be further improved.

(Method for Measuring Reduced Viscosity)

3.33 g (1 g as the solid content) of a 30% by mass N-methylpyrrolidone solution of the compound (1) is weighed into a 20 ml of volumetric flask and is diluted in the volumetric flask by N-methylpyrrolidone. The solution is allowed to stand in a constant-temperature tank at 30° C. for 30 minutes, and placed in an Ubbelohde reduced viscosity tube (viscometer constant=0.010 cSt/s) to measure a time required to flow down at 30° C. The measurement is performed twice with the same sample, and the average value of the measurement is calculated. The same measurement is performed in a case of a blank (only N-methylpyrrolidone), and the reduced viscosity (ml/g) is calculated from the following equation.

Reduced Viscosity (ml/g)={(Flow Time of Sample Solution (second)−Flow Time of Blank (second))/Flow Time of Blank (second)}/{(3.33× 0.3)/20}

The specific absorbance of the compound (1) represented by Equation ($A_\lambda$) is preferably 3 or less, more preferably 2 or less, and still more preferably 1 or less.

$$E = A/(c \times l)$$ ($A_\lambda$)

In Equation ($A_\lambda$), E represents a specific absorbance in the maximum absorption wavelength at a wavelength of 400 to 800 nm, A represents an absorbance in the maximum absorption wavelength at a wavelength of 400 to 800 nm, l represents a cell length in units of cm, and c represents a concentration of the compound (1) in the solution in units of mg/ml.

Hereinafter, Formula (1) will be described in detail.

In Formula (1), $R^1$ represents an (m+n)-valent linking group. Examples of the (m+n)-valent linking group include a group composed of 1 to 100 carbon atoms, 0 to 10 nitrogen atoms, 0 to 50 oxygen atoms, 1 to 200 hydrogen atoms, and 0 to 20 sulfur atoms. Examples of the (m+n)-valent linking group also include a group (which may form a ring structure) composed of the following structural unit or a combination of two or more the following structural units.

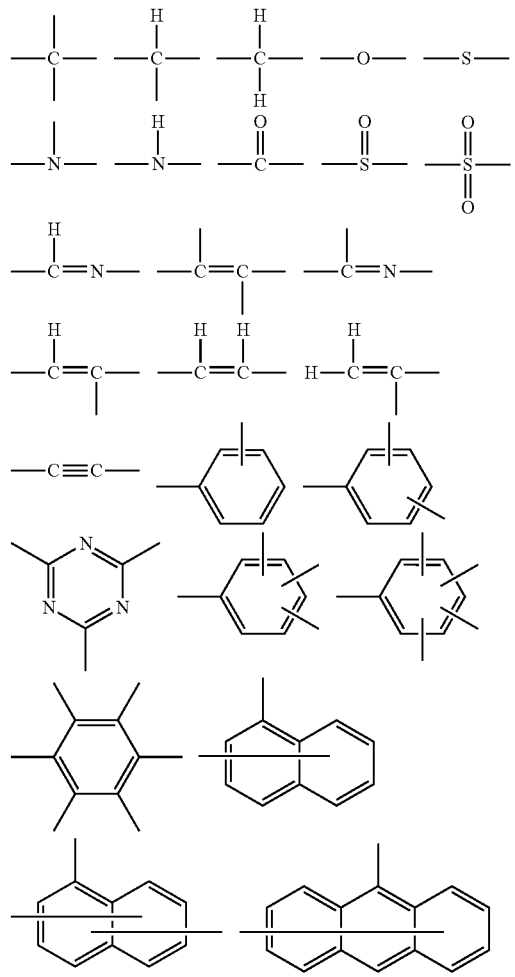

The (m+n)-valent linking group is preferably a group composed of 1 to 60 carbon atoms, 0 to 10 nitrogen atoms, 0 to 40 oxygen atoms, 1 to 120 hydrogen atoms, and 0 to 10 sulfur atoms, more preferably a group composed of 1 to 50 carbon atoms, 0 to 10 nitrogen atoms, 0 to 30 oxygen atoms, 1 to 100 hydrogen atoms, and 0 to 7 sulfur atoms, and particularly preferably a group composed of 1 to 40 carbon atoms, 0 to 8 nitrogen atoms, 0 to 20 oxygen atoms, 1 to 80 hydrogen atoms, and 0 to 5 sulfur atoms. In addition, the (m+n)-valent linking group is preferably a linking group derived from a polyfunctional thiol.

The (m+n)-valent linking group may have a substituent. Examples of the substituent include a halogen atom, an alkyl group, an alkoxy group, an alkoxycarbonyl group, an acyl group, an acyloxy group, an aryl group, a heterocyclic group, a hydroxyl group, an acid group, an ethylenically unsaturated bonding group, an amino group, and a cyano group.

In Formula (1), the formula weight of $R^1$ is preferably 200 to 2000. The upper limit is preferably 1800 or less and more preferably 1600 or less. The lower limit is preferably 300 or more and more preferably 400 or more. In a case where the formula weight of $R^1$ is within the above-described range, dispersion stability of the pigment in the composition can be improved. The formula weight of $R^1$ is a value calculated from the structural formula.

Specific examples of the (m+n)-valent linking group include linking groups having the following structures and linking groups having structures described in paragraph Nos. 0060 and 0061 of JP2013-043962A.

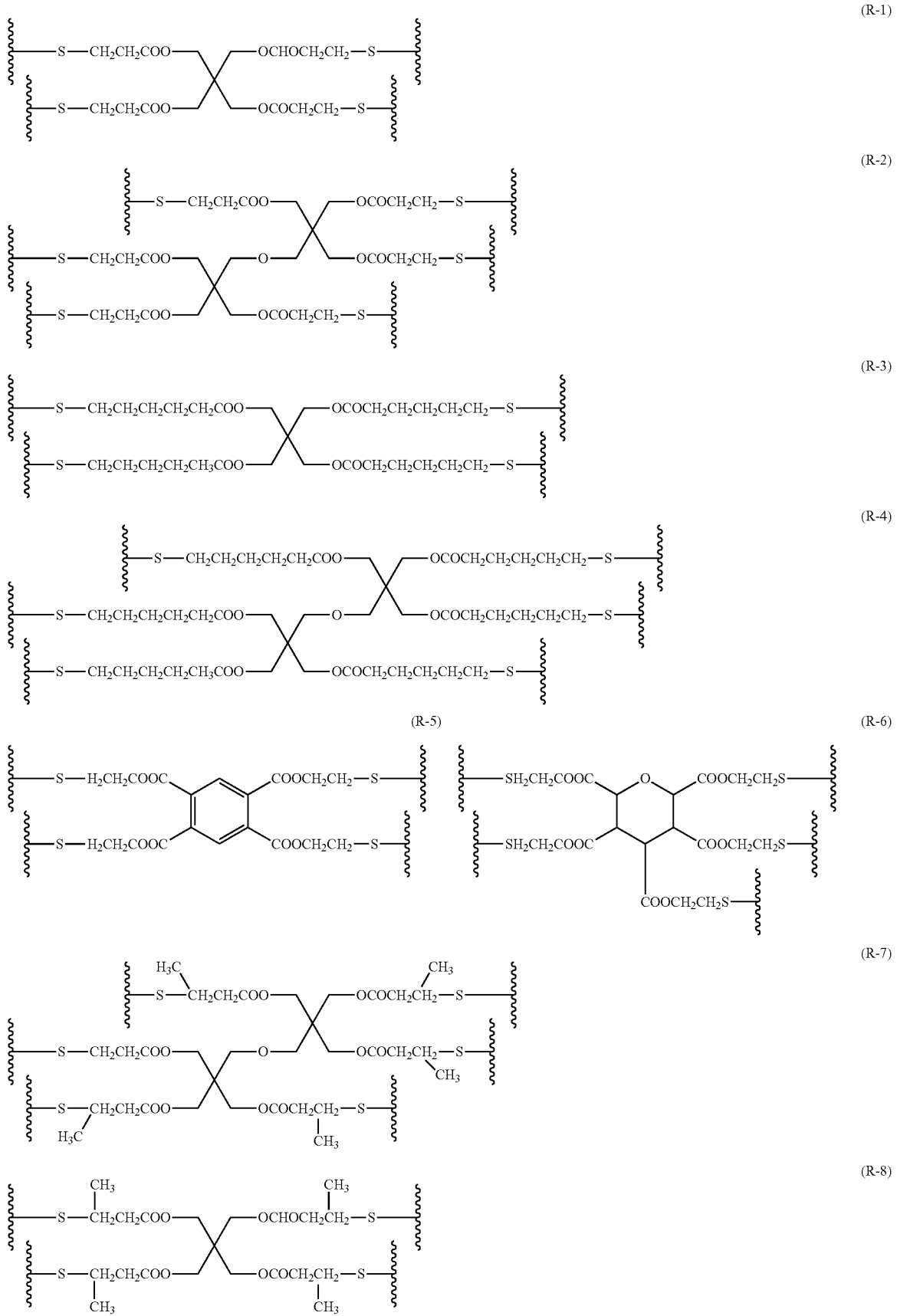

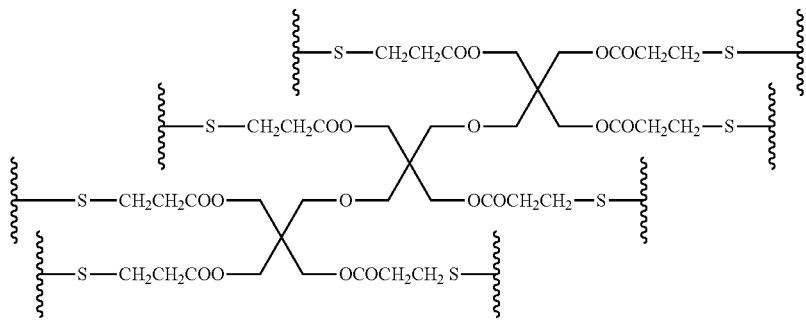
(R-9)
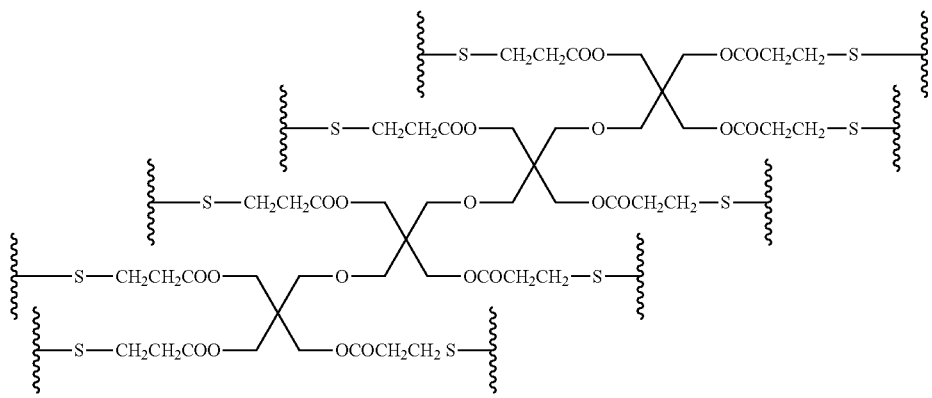
(R-10)
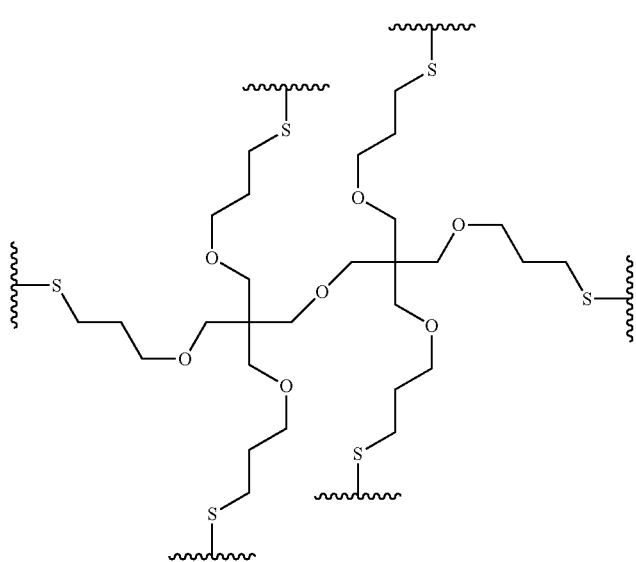
(R-11)

-continued
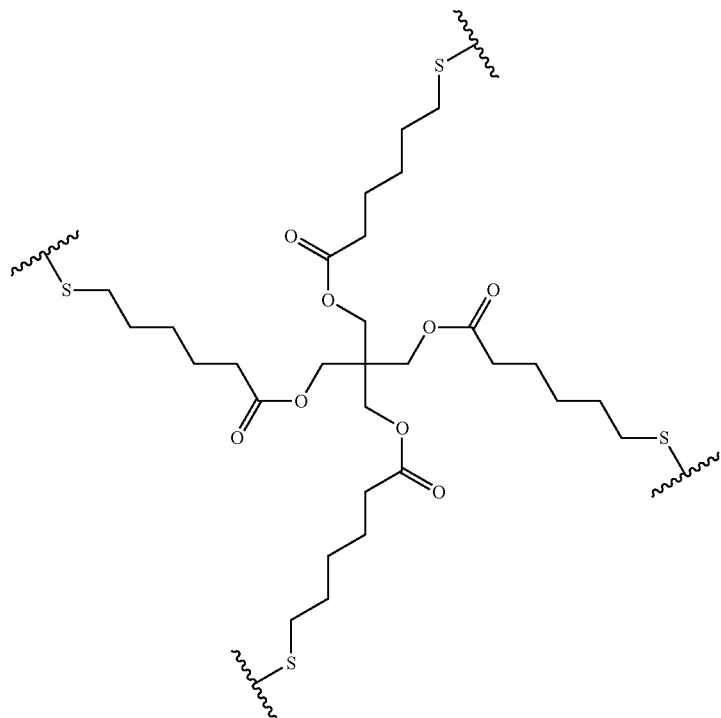
(R-12)
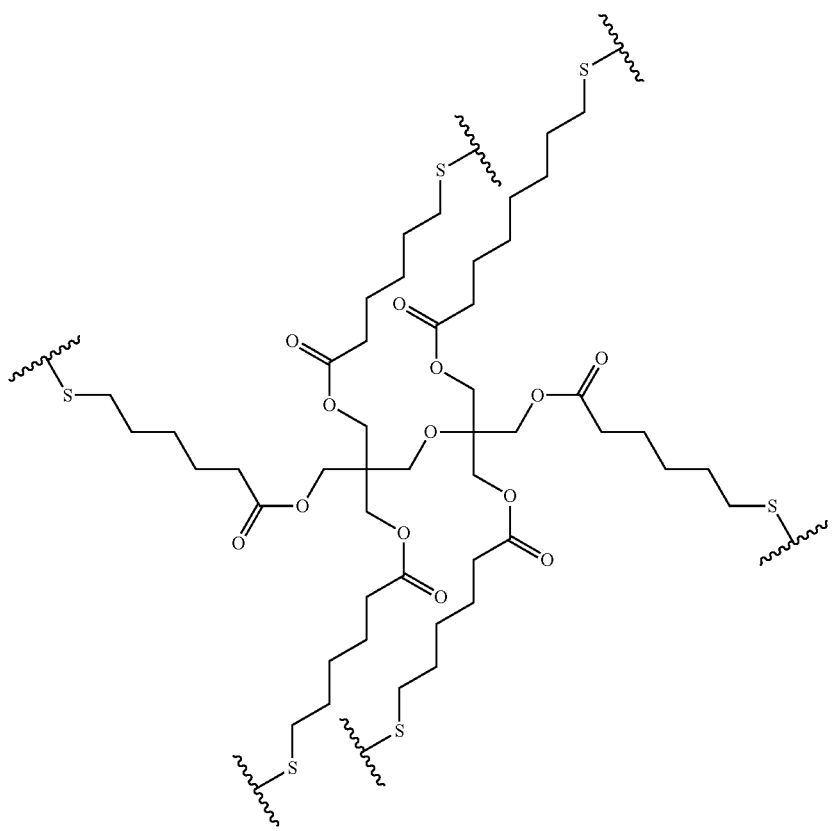
(R-13)

-continued
(R-14)
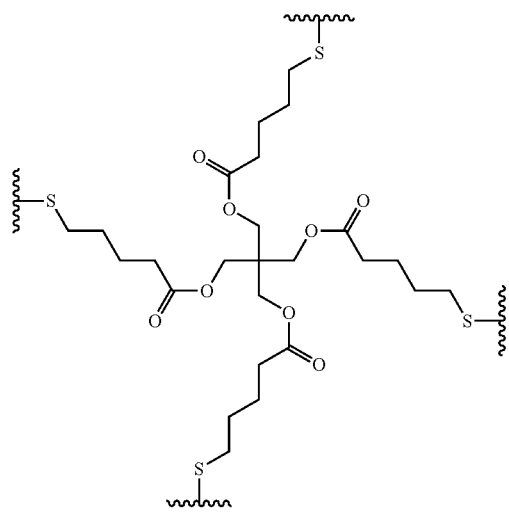
(R-15)
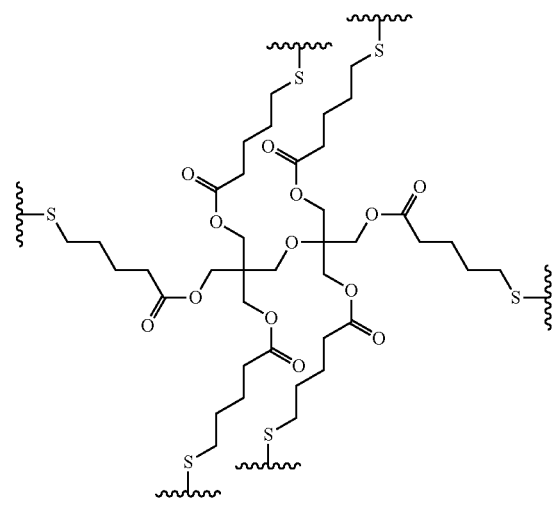
(R-16)
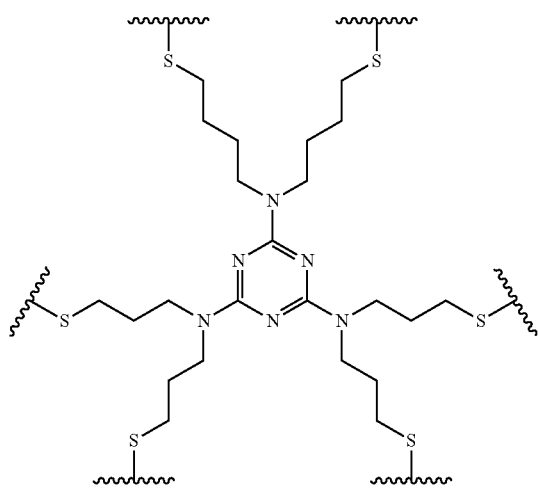
(R-17)
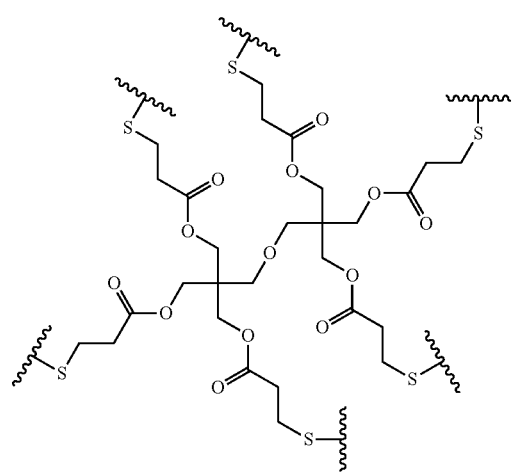
(R-18)
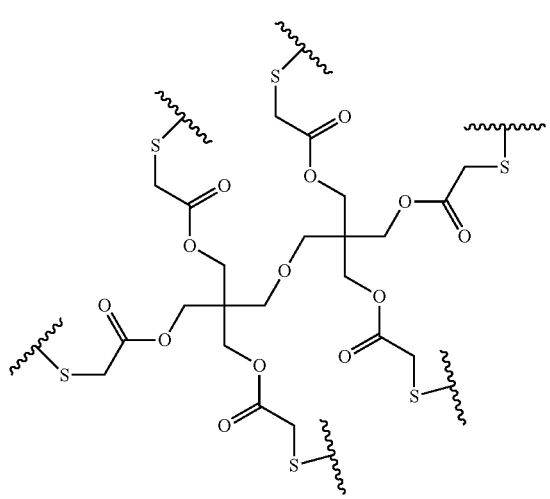

-continued (R-19)

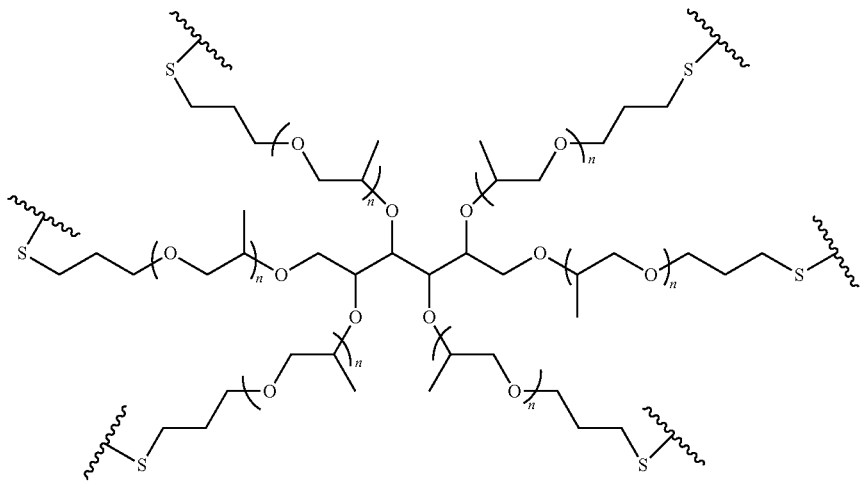

In Formula (1), pi represents a polymer chain which has, in the main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more.

The weight-average molecular weight of the polymer chain represented by $P^1$ is 1000 or more, and preferably 1000 to 10000. The upper limit is preferably 9000 or less, more preferably 6000 or less, and still more preferably 3000 or less. The lower limit is preferably 1200 or more and more preferably 1400 or more. Since the weight-average molecular weight of the polymer chain represented by $P^1$ is 1000 or more, dispersion stability of the pigment in the composition can be improved. The weight-average molecular weight of $P^1$ is a value calculated from the weight-average molecular weight of a raw material used for introducing the polymer chain. For example, by reacting a compound capable of forming the (m+n)-valent linking group, such as a polyfunctional thiol compound, with a macromonomer having at least one repeating unit selected from a polyether repeating unit, a polyester repeating unit, a polyamide repeating unit, a polyimide repeating unit, a polyimine repeating unit, or a polyurethane repeating unit, $P^1$ can be introduced into the (m+n)-valent linking group. Here, the macromonomer means a polymer compound in which a polymerizable group is introduced into a polymer terminal. In a case where $P^1$ is formed using the macromonomer, the weight-average molecular weight of the macromonomer corresponds to the weight-average molecular weight of $P^1$.

$P^1$ is preferably a polymer chain, in the main chain, having at least one repeating unit selected from a polyether repeating unit, a polyester repeating unit, a polyamide repeating unit, or a polyimide repeating unit, more preferably a polymer chain having a polyether repeating unit or a polyester repeating unit in the main chain, and from the viewpoint of dispersion stability of the pigment and developability, still more preferably a polymer chain having a polyester repeating unit in the main chain.

The polyester repeating unit is preferably a repeating unit having a structure represented by Formula (G-1), Formula (G-2), or Formula (G-3).

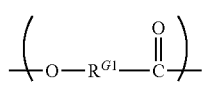

(G-1)

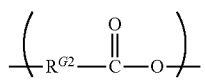

(G-2)

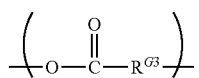

(G-3)

In the formulae, $R^{G1}$ to $R^{G3}$ respectively represent an alkylene group. The alkylene group represented by $R^{G1}$ to $R^{G3}$ preferably has 1 to 20 carbon atoms. The upper limit of carbon atom is preferably 15 or less, more preferably 10 or less, still more preferably 6 or less, and particularly preferably 5 or less. The lower limit is preferably 2 or more and more preferably 3 or more. The alkylene group represented by $R^{G1}$ to $R^{G3}$ is preferably linear or branched, and more preferably linear.

In addition, the polyester repeating unit preferably includes a repeating unit derived from a lactone compound, still more preferably includes a repeating unit derived from a compound selected from ε-caprolactone or δ-valerolactone, and particularly preferably includes a repeating unit derived from ε-caprolactone. Examples of the repeating unit derived from ε-caprolactone include a repeating unit having a structure represented by ε-CL described below. Examples of the repeating unit derived from δ-valerolactone include a repeating unit having a structure represented by δ-VL described below.

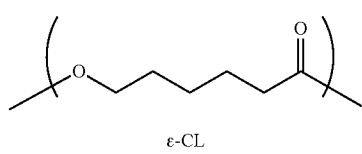

ε-CL

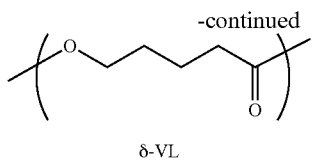

δ-VL

The polymer chain represented by $P^1$ is preferably a polymer chain represented by Formula (P1-1).

(P1-1)

$$\{-A^1-(L^1)_x-W^1$$

In the formula, $A^1$ represents a single bond or a divalent linking group, $L^1$ represents a polyether repeating unit, a polyester repeating unit, a polyamide repeating unit, a polyimide repeating unit, a polyimine repeating unit, or a polyurethane repeating unit, x represents a number of 2 or more, $W^1$ represents a hydrogen atom or a substituent, and a wavy line represents a linking hand.

In Formula (P1-1), examples of the divalent linking group represented by $A^1$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by combination of two or more these groups.

In Formula (P1-1), $L^1$ is preferably a polyether repeating unit, a polyester repeating unit, a polyamide repeating unit, or a polyimide repeating unit, more preferably a polyether repeating unit or a polyester repeating unit, and still more preferably a polyester repeating unit. As the preferred range of the polyester repeating unit, the above-described range is exemplified.

In Formula (P1-1), x represents a number of 2 or more, and is preferably 2 to 100. The upper limit is preferably 75 or less, more preferably 50 or less, from the viewpoint of dispersion stability of the pigment, still more preferably 30 or less, and particularly preferably 15 or less. From the viewpoint of dispersion stability of the pigment, the lower limit is preferably 3 or more and more preferably 5 or more.

In Formula (P1-1), $W^1$ represents a hydrogen atom or a substituent, and is preferably a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. These groups may have an additional substituent. Examples of the additional substituent include the above-described groups. Among these, from the viewpoint of dispersion stability of the pigment, $W^1$ is preferably a group having steric repulsion effect, more preferably an alkyl group or alkoxy group having 6 or more carbon atoms, and still more preferably an alkyl group or alkoxy group having 6 to 24 carbon atoms. The alkyl group and the alkoxy group is preferably linear or branched, and more preferably branched.

The polymer chain represented by $P^1$ is particularly preferably a polymer chain represented by Formula (P1-11), Formula (P1-12), or Formula (P1-13).

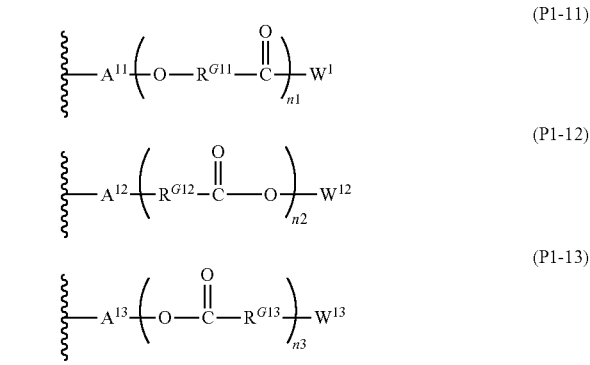

In the formulae, $A^{11}$ to $A^{13}$ respectively represent a single bond or a divalent linking group, $R^{G11}$ to $R^{G13}$ respectively represent an alkylene group, n1 to n3 respectively represent a number of 2 or more, $W^{11}$ to $W^{13}$ respectively represent a hydrogen atom or a substituent, and a wavy line represents a linking hand. n1 $R^{G11}$ may be the same as or different from each other. n2 $R^{G12}$ may be the same as or different from each other. n3 $R^{G13}$ may be the same as or different from each other.

$A^{11}$, n1, and $W^{11}$ in Formula (P1-1), $A^{12}$, n2, $W^{12}$ in Formula (P1-12), and $A^{13}$, n3, and $W^{13}$ in Formula (P1-13) respectively have the same meaning as $A^1$, x, and $W^1$ in Formula (P1-1), and the preferred range is also the same.

In the formulae, the alkylene group represented by $R^{G11}$ to $R^{G13}$ preferably has 1 to 20 carbon atoms. The upper limit of carbon atom is preferably 15 or less, more preferably 10 or less, still more preferably 6 or less, and particularly preferably 5 or less. The lower limit is preferably 2 or more and more preferably 3 or more. The alkylene group represented by $R^{G11}$ to $R^{G13}$ is preferably linear or branched, and more preferably linear.

In Formula (1), $P^2$ represents a polymer chain which is different from $P^1$ and has a repeating unit derived from a monomer having an ethylenically unsaturated bonding group in the main chain. The monomer having an ethylenically unsaturated bonding group is not particularly limited, and examples thereof include (meth)acrylic acid esters, crotonic esters, vinyl esters, maleic acid diesters, fumaric acid diesters, itaconic acid diesters, (meth)acrylamides, styrenes, vinyl ethers, vinyl ketones, olefins, maleimides, and (meth)acrylonitriles. With regard to details thereof, reference can be made to the description in paragraph Nos. 0088 to 0097 of JP2013-043962A, and the contents of which are incorporated herein by reference.

The molecular weight of the repeating unit derived from a monomer having an ethylenically unsaturated bonding group in the polymer chain represented by $P^2$ is preferably 1000 or less, more preferably 800 or less, and still more preferably 500 or less. According to this aspect, an effect in which the acid value of the compound (1) is easily increased while maintaining the dispersion stability of the pigment can be expected. Furthermore, the dispersity of the compound (1) is more easily reduced.

The repeating unit derived from a monomer having an ethylenically unsaturated bonding group in the polymer chain represented by $P^2$ is preferably a repeating unit including a partial structure represented by Formula (P2-1) and more preferably a repeating unit represented by Formula (P2-1-1).

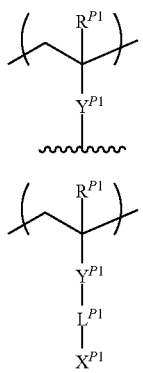

(P2-1)

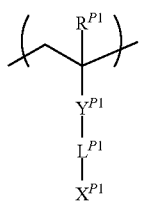

(P2-1-1)

In Formula (P2-1), $R^{P1}$ represents a hydrogen atom or an alkyl group, $Y^{P1}$ represents a single bond, an aryl group, —COO—, or —CONH—, and a wavy line represents a linking site. In Formula (P2-1-1), $R^{P1}$ represents a hydrogen atom or an alkyl group, $Y^{P1}$ represents a single bond, an aryl group, —COO—, or —CONH—, $L^1$ represents a single bond or a divalent linking group, and $X^1$ represents a hydrogen atom or a substituent.

$Y^{P1}$ is preferably a single bond, —COO—, or —CONH—, and more preferably —COO—.

Examples of the substituent represented by $X^1$ include a halogen atom, an alkyl group, an alkoxy group, an alkoxycarbonyl group, an acyl group, an acyloxy group, an aryl group, a heterocyclic group, a hydroxyl group, an acid group, an ethylenically unsaturated bonding group, an amino group, and a cyano group. Examples of the acid group include a carboxyl group, a sulfo group, a phosphoric acid group, a monosulfate group, a monophosphate group, and a borate group. Among these, a carboxyl group, a sulfo group, a monosulfate group, a phosphoric acid group, or a monophosphate group is preferable, a carboxyl group, a sulfo group, or a phosphoric acid group is more preferable, a carboxyl group or a sulfo group is still more preferable, and a carboxyl group is particularly preferable. Examples of the ethylenically unsaturated bonding group include a vinyl group, a styrene group, an allyl group, a methallyl group, and a (meth)acryloyl group, and a (meth)acryloyl group is preferable.

Examples of the divalent linking group represented by $L^1$ include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more these groups. The alkylene group, the alkyleneoxy group, and the oxyalkylenecarbonyl group may be any of linear, branched, and cyclic forms, and are preferably linear or branched. The alkylene group, the alkyleneoxy group, and the oxyalkylenecarbonyl group may have a substituent or may be unsubstituted. Examples of the substituent include a hydroxyl group and an alkoxy group.

In a case where $X^1$ is an acid group or an ethylenically unsaturated bonding group, from the viewpoint of developability and curability, it is preferable that $L^1$ is a divalent linking group. In addition, in this case, from the viewpoint of developability and curability, the divalent linking group represented by $L^1$ preferably has 2 or more atoms, more preferably has 4 or more atoms, still more preferably has 6 or more atoms, and even more preferably 8 or more atoms constituting a chain linking $Y^{P1}$ and $X^{P1}$. In addition, from the viewpoint of dispersion stability of the pigment, the upper limit is preferably 40 or less, more preferably 30 or less, and particularly preferably 25 or less. For example, in a case of the following repeating unit, the number of atoms constituting a chain linking $Y^{P1}$ (—COO—) and $X^1$ (acid group (—COOH)) is 12. The numerical value added to the site of $L^{P1}$ in the following structural formula is a number of atoms constituting a chain linking $Y^{P1}$ (—COO—) and $X^{P1}$ (—COOH).

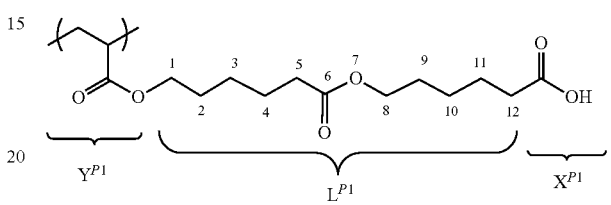

In addition, in the polymer chain represented by $P^2$, from the viewpoint of dispersion stability of the pigment, it is preferable that the side chain of the repeating unit is shorter than the polymer chain represented by $P^1$. For example, in a case of the above repeating unit, the site of $-L^{P1}-X^P$ corresponds to the side chain.

The polymer chain represented by $P^2$ preferably includes at least one repeating unit selected from a repeating unit having an acid group or a repeating unit having an ethylenically unsaturated bonding group, and more preferably includes a repeating unit having an acid group. In a case where the polymer chain represented by $P^2$ includes a repeating unit having an acid group, more excellent developability is easily obtained. In addition, in a case where the polymer chain represented by $P^2$ includes a repeating unit having an ethylenically unsaturated bonding group, more excellent curability is easily obtained.

In a case where the polymer chain represented by $P^2$ includes a repeating unit having an acid group, the content of the repeating unit having an acid group is preferably 20% by mole or more, more preferably 30% by mole or more, and still more preferably 50% by mole or more with respect to all the repeating units in the polymer chain represented by $P^2$. The upper limit may be 100% by mole, 90% by mole or less, or 80% by mole or less. In a case where the polymer chain represented by $P^2$ includes a repeating unit having an ethylenically unsaturated bonding group, the content of the repeating unit having an ethylenically unsaturated bonding group is preferably 3% by mole or more, more preferably 5% by mole, and still more preferably 10% by mole with respect to all the repeating units in the polymer chain represented by $P^2$. The upper limit may be 100% by mole, 90% by mole or less, or 80% by mole or less.

The polymer chain represented by $P^2$ may be composed of only the repeating unit having an acid group and/or the repeating unit having an ethylenically unsaturated bonding group, or may further include other repeating units having none of an acid group and an ethylenically unsaturated bonding group. In addition, the polymer chain represented by $P^2$ may be composed of only the other repeating units. The content of the other repeating units is preferably 50% by mole or less, more preferably 30% by mole or less, and still more preferably 20% by mole or less with respect to all the repeating units of the polymer chain represented by $P^2$, and it is particularly preferable that the polymer chain represented by $P^2$ does not contain the other repeating units substantially. The case where the polymer chain represented by $P^2$ does not contain the other repeating units substantially means that, the content of the other repeating units is 0.5% by mole or less with respect to all the repeating units of the polymer chain represented by $P^2$, preferably 0.1% by mole or less and still more preferably 0% by mole.

In Formula (1), m represents a number of 1 to 9, n represents a number of 1 to 9, and m+n satisfies 4 to 18.

The upper limit of m is preferably 8 or less, more preferably 6 or less, and still more preferably 5 or less. The lower limit of m is preferably 1 or more, more preferably 2 or more, and still more preferably 3 or more.

The upper limit of n is preferably 6 or less, more preferably 5 or less, and still more preferably 4 or less. The lower limit of n is preferably 1 or more, more preferably 2 or more, and still more preferably 3 or more.

In addition, from the viewpoint of dispersion stability, it is preferable that m is a number larger than n. In addition, from the viewpoint of developability, it is preferable that m is a number smaller than n.

m+n satisfies 4 to 18. The upper limit of m+n is preferably 12 or less, more preferably 10 or less, and still more preferably 8 or less. The lower limit of m+n is preferably 4 or more and more preferably 6 or more.

In the present invention, the compound (1) is preferably a compound represented by Formula (2).

In Formula (2), $R^{11}$ represents an (m+n)-valent linking group, $P^1$ represents a polymer chain which has, in a main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more, $P^2$ represents a polymer chain which is different from $P^1$ and has a repeating unit derived from a monomer having an ethylenically unsaturated bonding group in a main chain, S represents a sulfur atom, m represents a number of 1 to 9, n represents a number of 1 to 9, and m+n satisfies 4 to 18, in a case where m is 2 or more, m $P^1$'s may be the same as or different from each other, and in a case where n is 2 or more, n $P^2$'s may be the same as or different from each other.

$P^1$, $P^2$, m, n, and m+n in Formula (2) have the same meanings as that of Formula (1) in ranges, and preferred ranges thereof are also the same.

Examples of the (m+n)-valent linking group represented by $R^{11}$ in Formula (2) include a group composed of 1 to 100 carbon atoms, 0 to 10 nitrogen atoms, 0 to 50 oxygen atoms, 1 to 200 hydrogen atoms, and 0 to 20 sulfur atoms. Examples of the (m+n)-valent linking group also include a group (which may form a ring structure) composed of the following structural unit or a combination of two or more the following structural units.

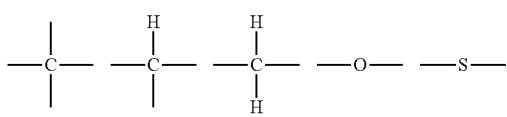

The (m+n)-valent linking group is preferably a group composed of 1 to 60 carbon atoms, 0 to 10 nitrogen atoms, 0 to 40 oxygen atoms, 1 to 120 hydrogen atoms, and 0 to 10 sulfur atoms, more preferably a group composed of 1 to 50 carbon atoms, 0 to 10 nitrogen atoms, 0 to 30 oxygen atoms, 1 to 100 hydrogen atoms, and 0 to 7 sulfur atoms, and particularly preferably a group composed of 1 to 40 carbon atoms, 0 to 8 nitrogen atoms, 0 to 20 oxygen atoms, 1 to 80 hydrogen atoms, and 0 to 5 sulfur atoms.

The (m+n)-valent linking group may have a substituent. Examples of the substituent include a halogen atom, an alkyl group, an alkoxy group, an alkoxycarbonyl group, an acyl group, an acyloxy group, an aryl group, a heterocyclic group, a hydroxyl group, an acid group, an ethylenically unsaturated bonding group, an amino group, and a cyano group.

In Formula (2), the formula weight of $R^{11}$ is preferably 400 to 2000. The upper limit is preferably 1800 or less and more preferably 1600 or less. The lower limit is preferably 200 or more and more preferably 300 or more. In a case where the formula weight of $R^{11}$ is within the above-described range, dispersion stability of the pigment in the composition can be improved. The formula weight of $R^{11}$ is a value calculated from the structural formula.

Specific examples of the compound (1) include compounds having the following structures. In the following structural formulae, l and m are respectively a number of 1 or more, x is a number of 2 or more, and n is a number of 2 or more. l+m represents a number of linking hands to a group $R^1$.

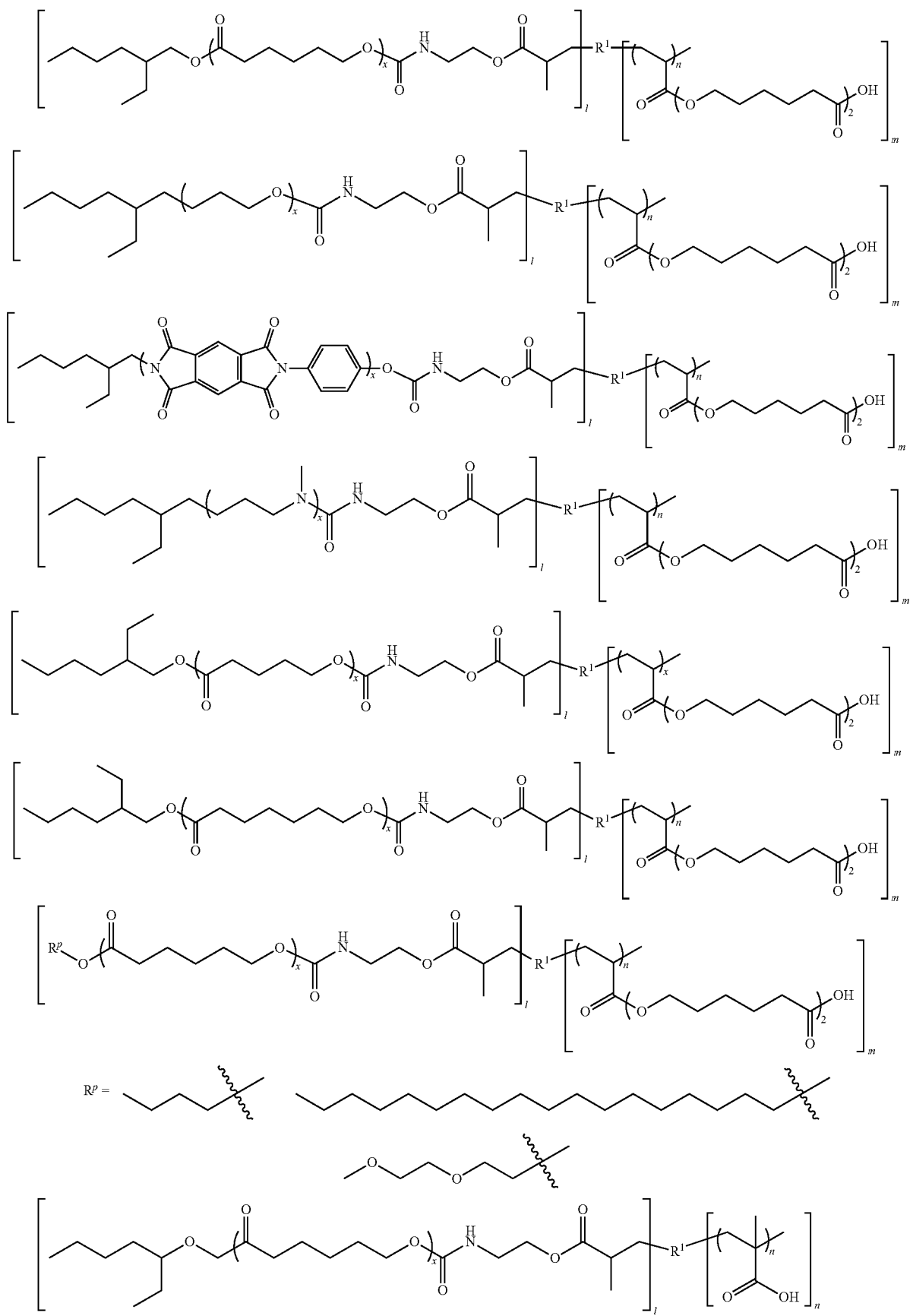

-continued

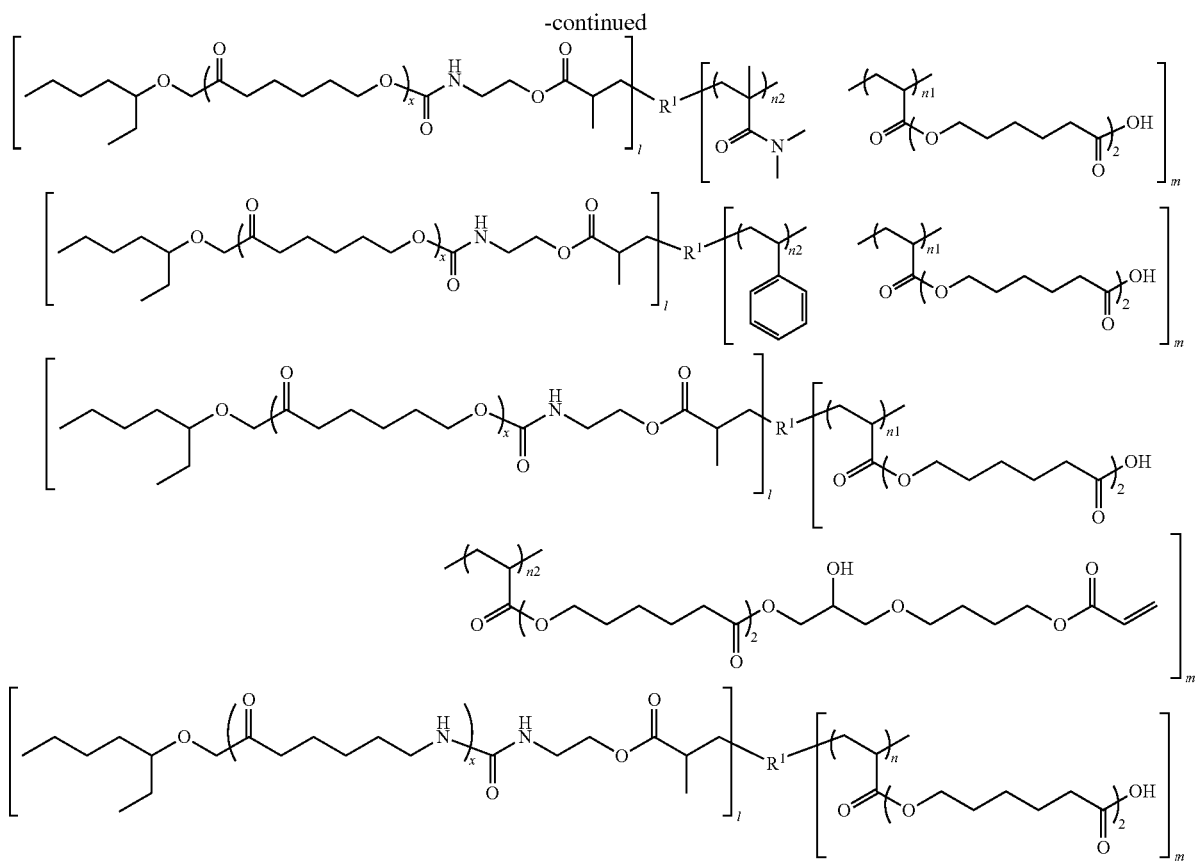

In the above structural formulae, $R^1$ is any of (R-1) to (R-19) described in the specific examples of the (m+n)-valent linking group.

In the composition according to the embodiment of the present invention, the content of the compound (1) is preferably 5% to 50% by mass with respect to the total solid content of the composition. The upper limit is preferably 40% by mass or less and more preferably 30% by mass or less. The lower limit is preferably 10% by mass or more and more preferably 15% by mass or more. In addition, the composition according to the embodiment of the present invention preferably contains the compound (1) 10 to 70 parts by mass with respect to 100 parts by mass of the pigment. The upper limit is preferably 60 parts by mass or less and more preferably 50 parts by mass or less. The lower limit is preferably 15 parts by mass or more and more preferably 20 parts by mass or more. In a case where the content of the compound (1) is within the above-described range, dispersion stability of the pigment in the composition is good. In the composition according to the embodiment of the present invention, the compound (1) may be used singly or in combination of two or more kinds thereof. In a case where two or more kinds of the compound (1)'s are used in combination, the total amount thereof is preferably within the range.

<<Method for Producing Compound (1)>>

Next, a method for producing the compound (1) will be described. The method for producing the compound (1) is not particularly limited, but for example, the compound (1) can be produced through a step of reacting a polyfunctional thiol compound with a macromonomer which has at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more, and a step of polymerizing a monomer having an ethylenically unsaturated bonding group in the presence of a reaction product obtained in the step of reacting.

As the method of reacting the polyfunctional thiol compound with the macromonomer, a known method can be used. Examples of the method include a Michael addition reaction and a radical reaction. As a radical generator used in the radical reaction, a known radical generator can be used. For example, azo compounds such as 2,2'-azobis(isobutyronitrile) (AIBN), 2,2'-azobis(2,4'-dimethylvaleronitrile), and dimethyl 2,2'-azobisisobutyrate, peroxides such as benzoyl peroxide, and persulfates such as potassium persulfate and ammonium persulfate can be used.

The weight-average molecular weight of the macromonomer is 1000 or more, and preferably 1000 to 10000. The upper limit is preferably 9000 or less, more preferably 6000 or less, and still more preferably 3000 or less. The lower limit is preferably 1200 or more and more preferably 1400 or more. The macromonomer has at least one repeating unit selected from a polyether repeating unit, a polyester repeating unit, a polyamide repeating unit, a polyimide repeating unit, a polyimine repeating unit, or a polyurethane repeating unit, preferably has at least one repeating unit selected from a polyether repeating unit, a polyester repeating unit, a polyamide repeating unit, or a polyimide repeating unit, more preferably a polyether repeating unit or a polyester repeating unit, and still more preferably a polyester repeating unit. The preferred range of the polyester repeating unit is the same as the range described in the section of compound (1). The macromonomer preferably includes two or more the above-described repeating units, more preferably includes 2 to 100 thereof. The upper limit is preferably 75 or less, more preferably 50 or less, from the viewpoint of dispersion stability of the pigment, still more preferably 30 or less, and particularly preferably 15 or less. From the viewpoint of dispersion stability of the pigment, the lower limit is preferably 5 or more and more preferably 7 or more.

The macromonomer has a polymerizable group at least one terminal of the macromonomer. Examples of the polymerizable group include ethylenically unsaturated bonding groups such as a vinyl group, a styrene group, an allyl group, a methallyl group, and a (meth)acryloyl group, and a (meth) acryloyl group is preferable.

The macromonomer preferably has a hydrogen atom or a substituent other than the polymerizable group in the other terminal, more preferably has a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. These groups may have a substituent. Examples of the additional substituent include the above-described groups. Among these, from the viewpoint of dispersion stability of the pigment, the substituent is preferably a group having steric repulsion effect, more preferably an alkyl group or alkoxy group having 6 or more carbon atoms, and still more preferably an alkyl group or alkoxy group having 6 to 24 carbon atoms. The alkyl group and the alkoxy group is preferably linear or branched, and more preferably branched.

As the macromonomer, a compound having the following structure is preferably used.

(MM-1)

In the formula, $B^{M1}$ represents a polymerizable group, $A^{M1}$ represents a single bond or a divalent linking group, $L^{M1}$ represents a polyether repeating unit, a polyester repeating unit, a polyamide repeating unit, a polyimide repeating unit, a polyimine repeating unit, or a polyurethane repeating unit, x represents a number of 2 or more, and $W^{M1}$ represents a hydrogen atom or a substituent.

Examples of the polymerizable group represented by $B^{M1}$ include ethylenically unsaturated bonding groups such as a vinyl group, a styrene group, an allyl group, a methallyl group, and a (meth)acryloyl group, and a (meth)acryloyl group is preferable.

Examples of the divalent linking group represented by $A^{M1}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by combination of two or more these groups.

$L^{M1}$ is preferably a polyether repeating unit, a polyester repeating unit, a polyamide repeating unit, or a polyimide repeating unit, more preferably a polyether repeating unit or a polyester repeating unit, and still more preferably a polyester repeating unit.

x represents a number of 2 or more, more preferably 2 to 100. The upper limit is preferably 75 or less, more preferably 50 or less, from the viewpoint of dispersion stability of the pigment, still more preferably 30 or less, and particularly preferably 15 or less. From the viewpoint of dispersion stability of the pigment, the lower limit is preferably 5 or more and more preferably 7 or more.

$W^{M1}$ is preferably a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. These groups may have a substituent. Examples of the additional substituent include the above-described groups. Among these, from the viewpoint of dispersion stability of the pigment, $W^1$ is preferably a group having steric repulsion effect, more preferably an alkyl group or alkoxy group having 6 or more carbon atoms, and still more preferably an alkyl group or alkoxy group having 6 to 24 carbon atoms. The alkyl group and the alkoxy group is preferably linear or branched, and more preferably branched.

As the polyfunctional thiol compound, a compound having 4 to 18 thiol groups in one molecule is used. Specific examples of the compound having 4 to 18 thiol groups in one molecule include the compounds described in paragraph Nos. 0122 to 0125 of JP2007-277514A, and the contents of which are incorporated herein by reference.

The reaction ratio of the polyfunctional thiol compound to the macromonomer is preferably such that the macromonomer is 2 to 10 mol with respect to 1 mol of the thiol group included in the polyfunctional thiol compound. The upper limit is preferably 9 mol or less and more preferably 8 mol or less. The lower limit is preferably 2 mol or more and more preferably 3 mol or more.

Next, a monomer having an ethylenically unsaturated bonding group is polymerized in the presence of the reaction product of the polyfunctional thiol compound and the macromonomer. The polymerization reaction between the reaction product and the monomer having an ethylenically unsaturated bonding group can be performed, for example, using a solution polymerization method. As the solution polymerization method, the polymerization can be performed by dissolving the reaction product and the monomer having an ethylenically unsaturated bonding group in an appropriate solvent, adding a radical polymerization initiator thereto, and reacting the solution at a temperature of about 50° C. to 220° C. As the solvent used in the solution polymerization method, a solvent can be arbitrarily selected according to solubility of the compounds described above. Examples thereof include methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethyl formamide, chloroform, and toluene. These solvents may be used as a mixture of two or more kinds thereof. In addition, as the radical polymerization initiator used in the solution polymerization method, azo compounds such as 2,2'-azobis(isobutyronitrile) (AIBN), 2,2'-azobis(2,4'-dimethylvaleronitrile), and dimethyl 2,2'-azobisisobutyrate, peroxides such as benzoyl peroxide, and persulfates such as potassium persulfate and ammonium persulfate can be used.

The reaction ratio of the reaction product to the monomer having an ethylenically unsaturated bonding group is preferably such that the monomer having an ethylenically unsaturated bonding group is 0.1 to 1.2 mol with respect to 1 mol of the thiol group included in the reaction product. The upper limit is preferably 1.1 mol or less and more preferably 1.0 mol or less. The lower limit is preferably 0.15 mol or more and more preferably 0.2 mol or more.

<<Pigment>>

The composition according to the embodiment of the present invention contains a pigment. Examples of the pigment include a white pigment, a black pigment, a chromatic pigment, and a near-infrared absorbing pigment. In the present invention, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, as the pigment, a pigment having a maximum absorption wavelength in a range of 400 to 2000 nm is preferable, and a pigment having a maximum absorption wavelength in a range of 400 nm to 700 nm is more preferable. In addition, in a case of using a pigment (preferably chromatic pigment) having a maximum absorption wavelength in a range of 400 nm to 700 nm, the composition according to the embodiment of the present invention can be preferably used as a composition for forming a colored layer in a color filter. Examples of the colored layer include a red colored layer, a green colored layer, a blue colored layer, a magenta colored layer, a cyan colored layer, and a yellow colored layer.

The average primary particle size of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle size of the pigment is within the above-described range, dispersion stability of the pigment in the composition is good. In the present invention, the primary particle size of the pigment can be determined from an image obtained by observing primary particles of the pigment using a transmission electron microscope. Specifically, a projected area of the primary particles of the pigment is determined, and the corresponding circle diameter is calculated as the primary particle size of the pigment. In addition, the average primary particle size in the present invention is the arithmetic average of the primary particle sizes in 400 primary particles of the pigment. In addition, the primary particle of the pigment refers to a particle which is independent without aggregation.

(Chromatic Pigment)

The chromatic pigment is not particularly limited, and a known chromatic pigment can be used. Examples of the chromatic pigment include a pigment having a maximum absorption wavelength in a range of 400 to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C. I. Pigment Green 7, 10, 36, 37, 58, 59, 62, and 63 (all of which are green pigments);

C. I. Pigment Violet 1, 19, 23, 27, 32, 37, and 42 (all of which are violet pigments); and C. I. Pigment Blue 1, 2, 15, 15:1, 15:2, 15:3, 15:4, 15:6, 16, 22, 60, 64, 66, 79, and 80 (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A. In addition, as the green pigment, a compound described in CN106909027A can be used.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

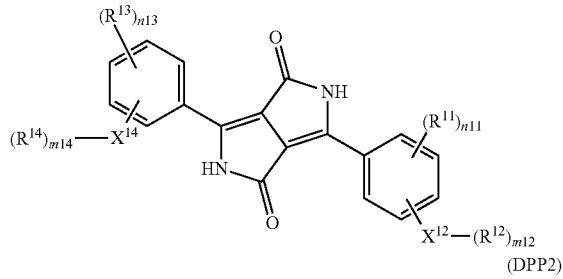

(DPP1)

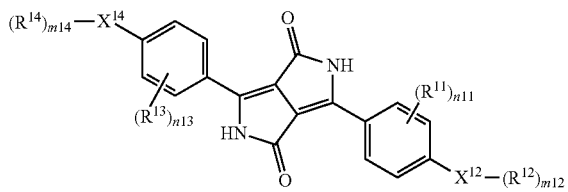

(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Examples of the substituent represented by $R^{11}$ and $R^{13}$ include the groups in the above-described substituent T, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present invention, the chromatic pigment may be used in combination of two or more kinds thereof. In addition, in a case where the chromatic pigment is used in combination of two or more kinds thereof, the combination of two or more chromatic pigments may form black. Examples of such a combination include the following aspects (1) to (7). In a case where two or more chromatic pigments are included in the composition and the combination of two or more chromatic pigments forms black, the composition according to the embodiment of the present invention can be preferably used as an infrared transmission filter.

(1) aspect in which a red pigment and a blue pigment are contained.
(2) aspect in which a red pigment, a blue pigment, and a yellow pigment are contained.
(3) aspect in which a red pigment, a blue pigment, a yellow pigment, and a violet pigment are contained.
(4) aspect in which a red pigment, a blue pigment, a yellow pigment, a violet pigment, and a green pigment are contained.
(5) aspect in which a red pigment, a blue pigment, a yellow pigment, and a green pigment are contained.
(6) aspect in which a red pigment, a blue pigment, and a green pigment are contained.
(7) aspect in which a yellow pigment and a violet pigment are contained.

In the above-described aspect (1), a mass ratio of the red pigment to the blue pigment is preferably red pigment:blue pigment=20 to 80:20 to 80, more preferably 20 to 60:40 to 80, and still more preferably 20 to 50:50 to 80.

In the above-described aspect (2), a mass ratio of the red pigment, the blue pigment, and the yellow pigment is preferably red pigment:blue pigment:yellow pigment=10 to 80:20 to 80:10 to 40, more preferably 10 to 60:30 to 80:10 to 30, and still more preferably 10 to 40:40 to 80:10 to 20.

In the above-described aspect (3), a mass ratio of the red pigment, the blue pigment, the yellow pigment, and the violet pigment is preferably red pigment:blue pigment:yellow pigment:violet pigment=10 to 80:20 to 80:5 to 40:5 to 40, more preferably 10 to 60:30 to 80:5 to 30:5 to 30, and still more preferably 10 to 40:40 to 80:5 to 20:5 to 20. In the above-described aspect (4), a mass ratio of the red pigment, the blue pigment, the yellow pigment, the violet pigment, and the green pigment is preferably red pigment:blue pigment:yellow pigment:violet pigment:green pigment=10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the above-described aspect (5), a mass ratio of the red pigment, the blue pigment, the yellow pigment, and the green pigment is preferably red pigment:blue pigment:yellow pigment:green pigment=10 to 80:20 to 80:5 to 40:5 to 40, more preferably 10 to 60:30 to 80:5 to 30:5 to 30, and still more preferably 10 to 40:40 to 80:5 to 20:5 to 20. In the above-described aspect (6), a mass ratio of the red pigment, the blue pigment, and the green pigment is preferably red pigment:blue pigment:green pigment=10 to 80:20 to 80:10 to 40, more preferably 10 to 60:30 to 80:10 to 30, and still more preferably 10 to 40:40 to 80:10 to 20.

In the above-described aspect (7), a mass ratio of the yellow pigment to the violet pigment is preferably yellow pigment:violet pigment=10 to 50:40 to 80, more preferably 20 to 40:50 to 70, and still more preferably 30 to 40:60 to 70.

(White Pigment)

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, a hollow resin particle, and zinc sulfide. The white pigment is preferably a particle having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

The titanium oxide has a content (purity) of titanium dioxide ($TiO_2$) of preferably 70% by mass or more, more preferably 80% by mass or more, and still more preferably 85% by mass or more. The titanium oxide has a content of lower titanium oxide represented by $Ti_nO_{2n-1}$ (n represents a number of 2 to 4), titanium oxynitride, and the like of preferably 30% by mass or less, more preferably 20% by mass or less, and still more preferably 15% by mass or less.

The shape of the titanium oxide is not particularly limited. Examples thereof include isotropic shapes (for example, a spherical shape, a polyhedral shape, and the like), anisotropic shapes (for example, a needle shape, a rod shape, a plate shape, and the like), and an irregular shape. The hardness (Mohs hardness) of the titanium oxide is preferably 5 to 8 and more preferably 7 to 7.5. The apparent specific gravity (density) of the titanium oxide is preferably 1.0 to 6.0 $g/cm^3$ and more preferably 3.9 to 4.5 $g/cm^3$. The bulk specific gravity of the titanium oxide is preferably 0.1 $g/cm^3$ to 1.0 $g/cm^3$ and more preferably 0.2 $g/cm^3$ to 0.4 $g/cm^3$.

The white pigment such as the titanium oxide may be a material of which a surface is treated with a surface treatment agent such as an organic compound. Examples of the surface treatment agent used for the surface treatment of the white pigment include polyol, aluminum oxide, aluminum hydroxide, silica (silicon oxide), hydrous silica, alkanolamine, stearic acid, organosiloxane, zirconium oxide, hydrogen dimethicone, a silane coupling agent, and a titanate coupling agent. Among these, a silane coupling agent is preferable. In addition, the white pigment such as the titanium oxide is preferably a material which is treated with a surface treatment agent of aluminum (Al), silicon (Si), and an organic substance. The surface treatment may be performed using a single type of surface treatment agent, or may be performed using a combination of two or more surface treatment agents. In addition, it is also preferable that the surface of the white pigment such as the titanium oxide is covered with an oxide such as aluminum oxide, silica, and zirconium oxide. From that, light resistance and dispersibility are further improved.

The white pigment such as the titanium oxide is preferably coated with a basic metal oxide or a basic metal hydroxide. Examples of the basic metal oxide or the basic metal hydroxide include metal compounds containing magnesium, zirconium, cerium, strontium, antimony, barium, calcium, or the like.

As the white pigment, a commercially available product can be preferably used. The commercially available product may be used as it is, or may be used after a classification treatment. Examples of a commercially available product of the titanium oxide include: trade names TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-401L, PT-501A, PT-501R, UT771, TTO-51C, TTO-80A, TTO-S-2, A-220, MPT-136, MPT-140, and MPT-141, manufactured by ISHIHARA SANGYO KAISHA, LTD.;

trade names R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, STR-100A-LP, STR-100C-LP, and TCA-123E, manufactured by Sakai Chemical Industry Co., Ltd.;

trade names JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, MT-700BS, MT-700HD, and MT-700Z, manufactured by TAYCA CORPORATION;

trade names KR-310, KR-380, KR-380N, and ST-485SA15, manufactured by Titan Kogyo, Ltd.;

trade names TR-600, TR-700, TR-750, TR-840, and TR-900, manufactured by Fuji Titanium Industry Co., Ltd.; and trade name Brilliant 1500 manufactured by Shiraishi Calcium Kaisha, Ltd. In addition, titanium oxide described in paragraph Nos. 0025 to 0027 of JP2015-067794A can also be used.

Examples of a commercially available product of strontium titanate include SW-100 (manufactured by Titan Kogyo, Ltd.). Examples of a commercially available product of barium sulfate include BF-1L (manufactured by Sakai Chemical Industry Co., Ltd.). Examples of a commercially available product of zinc oxide include Zincox Super F-1 (manufactured by Hakusui Tech Co., Ltd.). Examples of a commercially available product of zirconium oxide include Z—NX (manufactured by Taiyo Engineering Corporation).

In addition, as the white pigment, the titanium oxide described in "Titanium Oxide-Physical Properties and Applied Technology, written by Manabu Kiyono, pages 13 to 45, published in Jun. 25, 1991, published by Shuppan Co., Ltd." can also be used.

The white pigment is not limited to a compound consisting of a single inorganic substance, and may be a particle combined with other materials. For example, it is preferable to use a particle having a pore or other materials therein, a particle having a number of inorganic particles attached to a core particle, or a core-shell composite particle composed of a core particle consisting of polymer particles and a shell layer consisting of inorganic fine nanoparticles. With regard to the core-shell composite particle composed of a core particle consisting of polymer particles and a shell layer consisting of inorganic fine nanoparticles, reference can be made to, for example, the descriptions in paragraph Nos. 0012 to 0042 of JP2015-047520A, the contents of which are incorporated herein by reference.

As the white pigment, a hollow inorganic particle can also be used. The hollow inorganic particle refers to an inorganic particle having a structure with a cavity therein, and the cavity is enclosed by an outer shell. As the hollow inorganic particle, the hollow inorganic particle described in JP2011-075786A, WO2013-061621A, JP2015-164881A, and the like can be used, the contents of which are incorporated herein by reference.

(Black Pigment)

The black pigment is not particularly limited, and a known black pigment can be used. Examples thereof include carbon black, titanium black, and graphite, and carbon black or titanium black is preferable and titanium black is more preferable. The titanium black is a black particle containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7.

It is preferable that the titanium black has a small primary particle size of the individual particles and has a small average primary particle size. Specifically, the average primary particle size thereof is preferably 10 to 45 nm.

The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, and the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

(Near-Infrared Absorbing Pigment)

The near-infrared absorbing pigment is preferably an organic pigment. In addition, the near-infrared absorbing pigment preferably has a maximum absorption wavelength in a range of more than 700 nm and 1400 nm or less. In addition, the maximum absorption wavelength of the near-infrared absorbing pigment is preferably 1200 nm or less, more preferably 1000 nm or less, and still more preferably 950 nm or less.

In addition, in the near-infrared absorbing pigment, $A_{550}/A_{max}$ which is a ratio of an absorbance $A_{550}$ at a wavelength of 550 nm to an absorbance $A_{max}$ at the maximum absorption wavelength is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared rays shielding property can be obtained.

In the present invention, the maximum absorption wavelength of the near-infrared absorbing pigment and values of absorbance at each wavelength are values obtained from an absorption spectrum of a film formed using a composition including the near-infrared absorbing pigment.

The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from a pyrrolopyrrole compound, a squarylium compound, a cyanine compound, a phthalocyanine compound, or a naphthalocyanine compound is preferable, and a pyrrolopyrrole compound or a squarylium compound is more preferable, and a pyrrolopyrrole compound is particularly preferable.

In the composition according to the embodiment of the present invention, the content of the pigment is preferably 5% by mass or more, more preferably 7% by mass or more, and particularly preferably 10% by mass or more with respect to the total solid content of the composition. The upper limit is not particularly limited, but is preferably 70% by mass or less, more preferably 65% by mass or less, and most preferably 60% by mass or less with respect to the total solid content of the composition.

<<Dye>>

The composition according to the embodiment of the present invention can contain a dye. The dye is not particularly limited and a known dye can be used. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, the thiazole compound described in JP2012-158649A, the azo compound described in JP2011-184493A, or the azo compound described in JP2011-145540A can also be used. In addition, as yellow dyes, the quinophthalone compounds described in paragraph Nos. 0011 to 0034 of JP2013-054339A, the quinophthalone compounds described in paragraph Nos. 0013 to 0058 of JP2014-026228A, or the like can be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound.

In a case where the composition according to the embodiment of the present invention contains a dye, the content of the dye is preferably 5% by mass or more, more preferably 7% by mass or more, and particularly preferably 10% by mass or more with respect to the total solid content of the composition. The upper limit is not particularly limited, but is preferably 70% by mass or less, more preferably 65% by mass or less, and most preferably 60% by mass or less with respect to the total solid content of the composition.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the composition according to the embodiment of the present invention does not contain the dye substantially. The case where the composition according to the embodiment of the present invention contains does not contain the dye substantially means that the content of the dye in the total solid content of the composition according to the embodiment of the present invention is preferably 0.1% by mass or less, more preferably 0.05% by mass or less, and particularly preferably 0% by mass.

<<Polymerizable Monomer>>

The composition according to the embodiment of the present invention can contain a polymerizable monomer in addition to the compound (1). The polymerizable monomer is preferably a compound which can be polymerized by an action of a radical. That is, the polymerizable monomer is preferably a radical polymerizable monomer. The polymerizable monomer is preferably a compound having two or more ethylenically unsaturated bonding groups, and still more preferably a compound having three or more ethylenically unsaturated bonding groups. The upper limit of the number of ethylenically unsaturated bonding groups in the polymerizable monomer is, for example, preferably 15 or less and more preferably 6 or less. Examples of the ethylenically unsaturated bonding group include a vinyl group, a styrene group, an allyl group, a methallyl group, and a (meth)acryloyl group, and a (meth)acryloyl group is preferable. The polymerizable monomer is preferably a trifunctional to pentadecafunctional (meth)acrylate compound and more preferably a trifunctional to hexafunctional (meth)acrylate compound.

The molecular weight of the polymerizable monomer is preferably 200 to 3000. The upper limit of the molecular weight is preferably 2500 or less and still more preferably 2000 or less. The lower limit of the molecular weight is preferably 250 or more and still more preferably 300 or more.

With regard to the polymerizable monomer, reference can be made to the description in paragraph Nos. 0033 and 0034 of JP2013-253224A, and the contents of which are incorporated herein by reference. Examples of the polymerizable monomer include compounds such as ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., and A-DPH-12E manufactured by Shin-Nakamura Chemical Co., Ltd.), and a compound having a structure in which the (meth)acryloyl group is bonded through an ethylene glycol and/or a propylene glycol residue. In addition, an oligomer type of these compounds can be used. In addition, as the polymerizable monomer, diglycerin ethylene oxide (EO)-modified (meth)acrylate (as a commercially available product, M-460 manufactured by TOAGOSEI CO., LTD.), pentaerythritol tetraacrylate (A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), and ARONIX TO-2349 (manufactured by TOAGOSEI CO., LTD.) can also be used.

The polymerizable monomer may have an acid group such as a carboxyl group, a sulfo group, and a phosphoric acid group. Examples of a commercially available product of the polymerizable monomer having an acid group include ARONIX M-305, M-510, and M-520, (all manufactured by TOAGOSEI CO., LTD.). The acid value of the polymerizable monomer having an acid group is preferably 0.1 to 40 mgKOH/g. The lower limit is preferably 5 mgKOH/g or more. The upper limit is preferably 30 mgKOH/g or less.

The polymerizable monomer is preferably a compound having a caprolactone structure. With regard to the polymerizable monomer having a caprolactone structure, reference can be made to the description in paragraph Nos. 0042 to 0045 of JP2013-253224A, and the contents of which are incorporated herein by reference. Examples of a commercially available product of the compound having a caprolactone structure include KAYARAD DPCA-20, DPCA-30, DPCA-60, and DPCA-120 (manufactured by Nippon Kayaku Co., Ltd.).

As the polymerizable monomer, a compound having an ethylenically unsaturated bonding group and an alkyleneoxy group can also be used. The compound having an ethylenically unsaturated bonding group and an alkyleneoxy group is preferably a compound having an ethylenically unsaturated bonding group and an ethyleneoxy group and/or a propyleneoxy group, more preferably a compound having an ethylenically unsaturated bonding group and an ethyleneoxy group, and still more preferably a trifunctional to hexafunctional (meth)acrylate compound having 4 to 20 ethyleneoxy groups. Examples of a commercially available product of the compound having an ethylenically unsaturated bonding group and an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd, which is a trifunctional (meth)acrylate having three isobutyleneoxy groups.

As the polymerizable monomer, the urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) can also be used. In addition, the addition-polymerizable compounds having an amino structure or a sulfide structure in the molecule described in JP1988-277653A (JP-S63-277653A), JP1988-260909A (JP-S63-260909A), or JP1989-105238A (JP-H01-105238A) can also be used. Examples of a commercially available product include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.). In addition, as the polymerizable monomer, the compounds described in JP2017-048367A, JP6057891B, or JP6031807B can also be used.

The content of the polymerizable monomer is preferably 0.1% to 50% by mass with respect to the total solid content of the composition. The lower limit is preferably 0.5% by mass or more, more preferably 1% by mass or more, and still more preferably 5% by mass or more. The upper limit is preferably 40% by mass or less, more preferably 30% by mass or less, and still more preferably 20% by mass or less. The polymerizable monomer may be used singly or in combination of two or more kinds thereof. In a case where two or more kinds of the polymerizable monomers are used in combination, the total amount thereof is preferably within the range.

<<Photopolymerization Initiator>>

The composition according to the embodiment of the present invention can further include a photopolymerization initiator. In particular, in a case where the composition according to the embodiment of the present invention includes the polymerizable monomer, it is preferable to include the photopolymerization initiator. The photopolymerization initiator is not particularly limited, and it is possible to appropriately select from known photopolymerization initiators. For example, a compound having photosensitivity to light in a range from the ultraviolet range to the visible range is preferable. It is preferable that the photopolymerization initiator is a photoradical polymerization initiator.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of the exposure sensitivity, as the photopolymerization initiator, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from the oxime compound, the α-hydroxyketone compound, the α-aminoketone compound, and the acylphosphine compound is more preferable, and the oxime compound is still more preferable.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, and the compounds described in WO2017/051680A. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Examples of a commercially available product thereof include IRGACURE-OXE01, IRGACURE-OXE02, IRGACURE-OXE03, and IRGACURE-OXE04 (all manufactured by BASF), TR-PBG-304

(manufactured by TRONLY), and ADEKA OPTOMER N-1919 (manufactured by ADKEA Corporation; photopolymerization initiator 2 described in JP2012-014052A). In addition, as the oxime compound, a compound having no coloration property or a compound having high transparency and being difficult to discolor can also be preferably used. Examples of a commercially available product thereof include ADEKA ARKLS NCI-730, NCI-831, and NCI-930 (all manufactured by ADEKA Corporation).

In the present invention, an oxime compound having a fluorene ring can also be used as the photopolymerization initiator. Specific examples of the oxime compound having a fluorene ring include the compounds described in JP2014-137466A. The contents of the publications are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A. The contents of the publications are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which is preferably used in the present invention are shown below, but the present invention is not limited thereto.

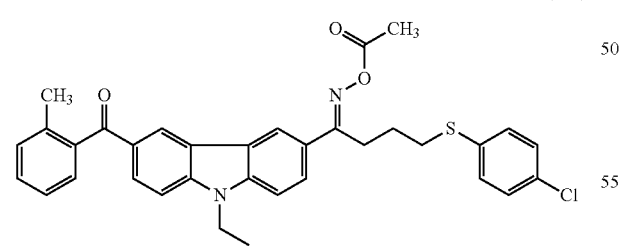

(C-1)

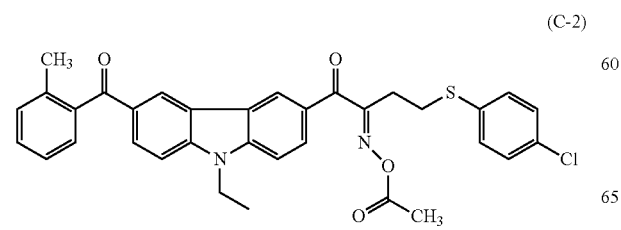

(C-2)

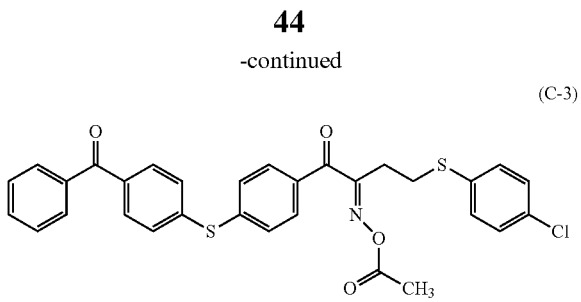

(C-3)

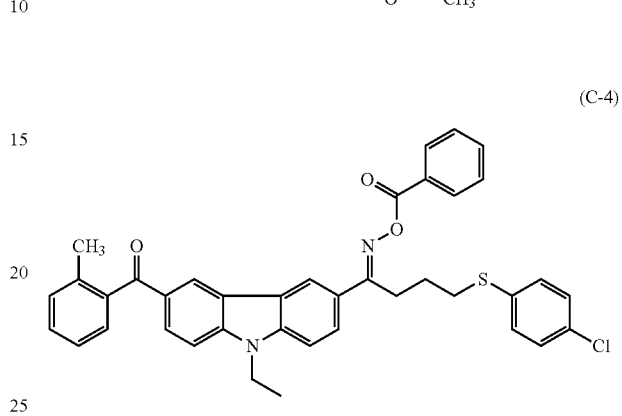

(C-4)

(C-5)

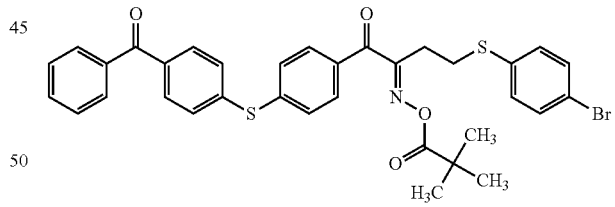

(C-6)

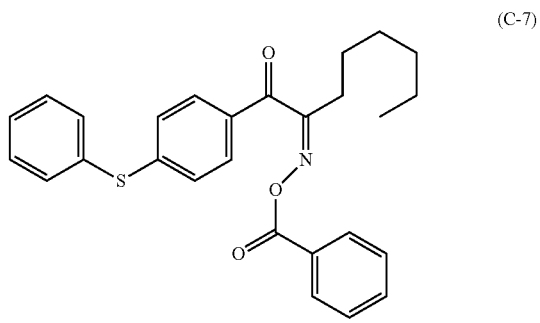

(C-7)

(C-8)
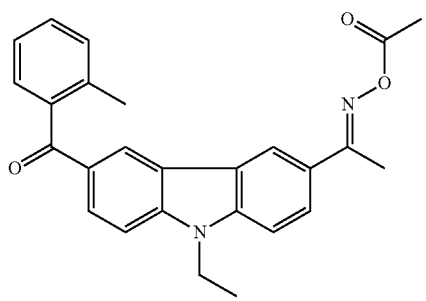

(C-9)
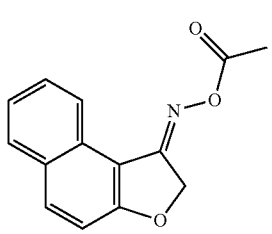

(C-10)
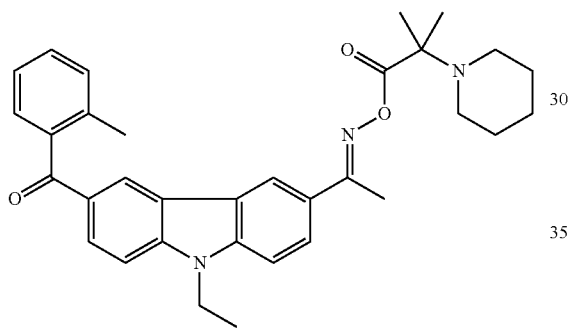

(C-11)
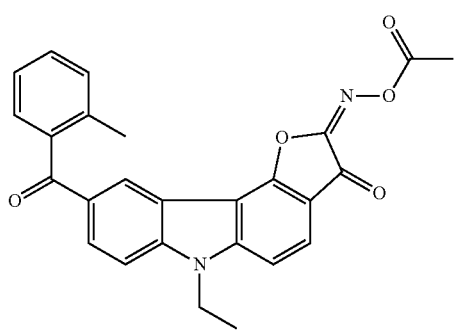

(C-12)
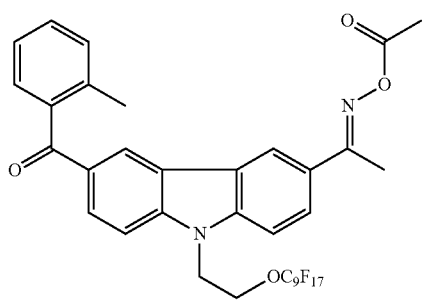

(C-13)
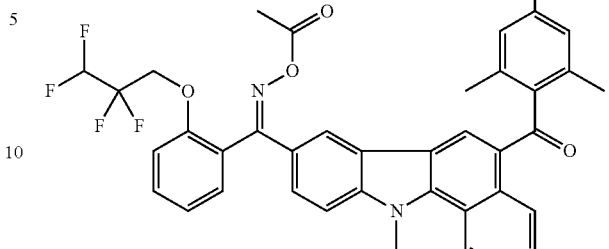

(C-14)
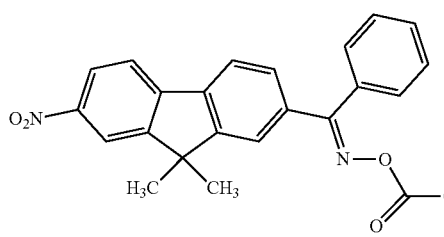

(C-15)
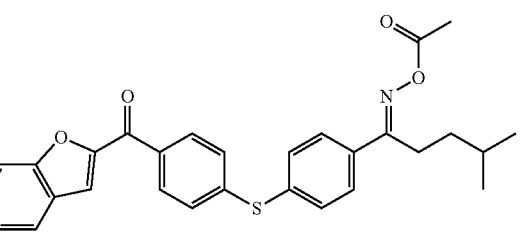

(C-16)
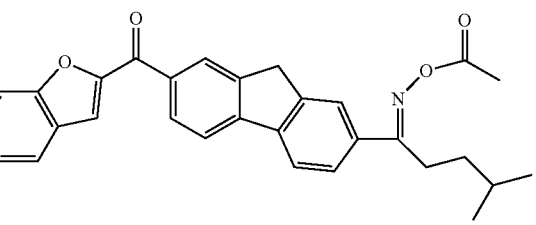

As the oxime compound, a compound having a maximum absorption wavelength in a range of 350 to 500 nm is preferable, and a compound having a maximum absorption wavelength in a range of 360 nm to 480 nm is more preferable. In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of a compound can be measured using a known method. For example, the molar absorption coefficient is preferably measured by means of a spectrophotometer (Cary-5 spectrophotometer, manufactured by Varian) at a concentration of 0.01 g/L using ethyl acetate solvent.

In the present invention, a bifunctional, or trifunctional or higher photoradical polymerization initiator may be used as the photopolymerization initiator. By using such a photopolymerization initiator, two or more radicals are generated from one molecule of the photopolymerization initiator, as a result, good sensitivity is obtained. In addition, in a case of using a compound having an asymmetric structure, crystallinity is reduced so that solubility in a solvent or the like is improved, precipitation becomes difficult over time, and temporal stability of the composition can be improved. Specific examples of such a photopolymerization initiator include the dimers of the oxime compounds described in JP2010-527339A, JP2011-524436A, WO2015/004565A, paragraph Nos. 0412 to 0417 of JP2016-532675A, and paragraph Nos. 0039 to 0055 of WO2017/033680A, the compound (E) and the compound (G) described in JP2013-522445A, Cmpd 1 to 7 described in WO2016/034963A, the oxime ester photoinitiators described in paragraph No. 0007 of JP2017-523465A, the photoinitiators described in paragraph Nos. 0020 to 0033 of JP2017-167399A, and the photopolymerization initiator (A) described in paragraph Nos. 0017 to 0026 of JP2017-151342A.

The content of the photopolymerization initiator is preferably 0.1% to 30% by mass with respect to the total solid content of the composition. The lower limit is, for example, preferably 0.5% by mass or more, and more preferably 1% by mass or more. The upper limit is, for example, preferably 20% by mass or less, more preferably 15% by mass or less, and still more preferably 10% by mass or less. The composition according to the embodiment of the present invention may include only one kind or two or more kinds of the photopolymerization initiators. In a case of including two or more kinds of the photopolymerization initiators, the total amount thereof is preferably within the above-described range.

<<Other Resins>>

The composition according to the embodiment of the present invention can further contain a resin (hereinafter, also referred to as other resins) in addition to the compound (1). The other resins are blended in, for example, an application as a binder or an application for dispersing particles such as a pigment in a composition. Mainly, a resin which is used for dispersing particles such as a pigment is also referred to as a dispersant. However, such applications of the resin are only exemplary, and the resin can also be used for other purposes in addition to such applications.

The weight-average molecular weight (Mw) of the other resins is preferably 2000 to 2000000. The upper limit is preferably 1000000 or less and more preferably 500000 or less. The lower limit is preferably 3000 or more and more preferably 5000 or more.

Examples of the other resins include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof.

The other resins may have an acid group. Examples of the acid group include a carboxyl group, a phosphoric acid group, a sulfo group, and a phenolic hydroxyl group, and a carboxyl group is preferable. These acid groups may be used singly or in combination of two or more kinds thereof. The resin having an acid group can also be used as an alkali-soluble resin.

The resin having an acid group is preferably a polymer having a carboxyl group in the side chain. Specific examples thereof include methacrylic acid copolymers, acrylic acid copolymers, itaconic acid copolymers, crotonic acid copolymers, maleic acid copolymers, partially esterified maleic acid copolymers, alkali-soluble phenol resins such as novolak resin, acidic cellulose derivatives having a carboxyl group in the side chain, and resins in which an acid anhydride is added to a polymer having a hydroxyl group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and glycidyl (meth)acrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. In addition, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be one kind or two or more kinds thereof.

As the resin having an acid group, a benzyl (meth)acrylate/(meth)acrylic acid copolymer, a benzyl (meth)acrylate/(meth)acrylic acid/2-hydroxyethyl (meth)acrylate copolymer, or a multicomponent copolymer consisting of benzyl (meth)acrylate/(meth)acrylic acid/other monomers can be preferably used. Further, a compound obtained by copolymerizing 2-hydroxyethyl (meth)acrylate, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used.

The resin having an acid group may further include a repeating unit derived from a monomer component including a compound represented by Formula (ED1) and/or a compound represented by Formula (ED2) (hereinafter, these compounds may be referred to as an "ether dimer").

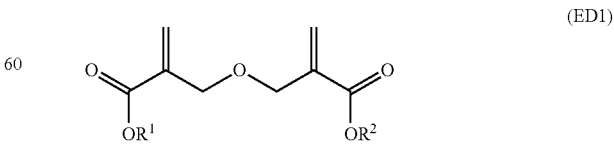

(ED1)

In Formula (ED1), $R^1$ and $R^2$ each independently represent a hydrogen atom or a hydrocarbon group having 1 to 25 carbon atoms, which may have a substituent.

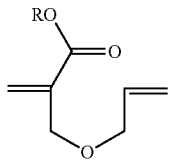

(ED2)

In Formula (ED2), R represents a hydrogen atom or an organic group having 1 to 30 carbon atoms. With regard to Formula (ED2), reference can be made to JP2010-168539A.

With regard to the ether dimer, reference can be made to paragraph No. 0317 of JP2013-029760A, and the contents of which are incorporated herein by reference. The ether dimers may be used singly or in combination of two or more kinds thereof.

The resin having an acid group may include a repeating unit derived from a compound represented by Formula (X).

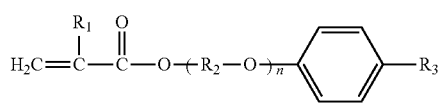

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

With regard to the resin having an acid group, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, and the contents of which are incorporated herein by reference. A commercially available product can also be used as the resin having an acid group.

An acid value of the resin having an acid group is preferably 30 to 200 mgKOH/g. The lower limit is preferably 50 mgKOH/g or more and more preferably 70 mgKOH/g or more. The upper limit is preferably 150 mgKOH/g or less and more preferably 120 mgKOH/g or less.

Examples of the resin having an acid group include a resin having the following structure.

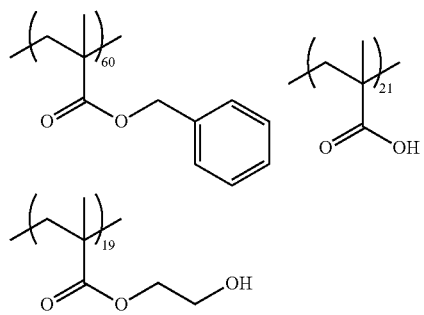

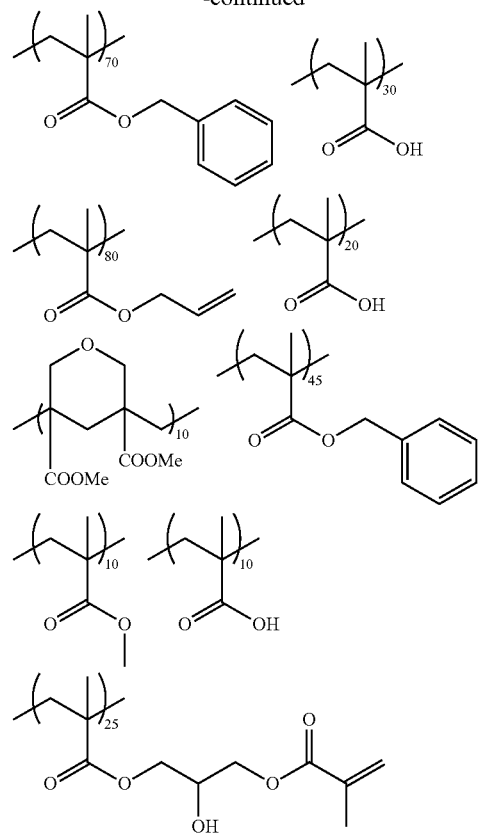

The composition according to the embodiment of the present invention can also include a dispersant as the other resins. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50% by mole in a case where the total amount of the acid group and the basic group is 100% by mole. The basic group contained in the basic dispersant is preferably an amino group.

The resin used as a dispersant preferably includes a repeating unit having an acid group. In a case where the resin used as a dispersant includes the repeating unit having an acid group, generation of a development residue can be further suppressed in the formation of a pattern by a photolithography method.

The resin used as a dispersant is also preferably a graft resin. With regard to details of the graft resin, reference can be made to the description in paragraph Nos. 0025 to 0094 of JP2012-255128A, and the contents thereof are incorporated herein by reference.

It is preferable that the resin used as a dispersant is a polyimine-based dispersant including a nitrogen atom in at least one of the main chain or the side chain. As the polyimine-based dispersant, a resin having a structural unit having a partial structure X having a functional group of pKa14 or less, and the side chain including a side chain Y having 40 to 10,000 atoms, in which at least one of the main chain or the side chain has a basic nitrogen atom is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, and the contents thereof are incorporated herein by reference.

A commercially available product is also available as the dispersant, and specific examples thereof include Disperbyk series (for example, Disperbyk-161 and the like) manufactured by BYK Chemie Japan. The dispersing agent described in paragraph Nos. 0041 to 0130 of JP2014-130338A can also be used, and the contents of which are incorporated herein by reference. The resin having an acid group and the like can also be used as the dispersant.

A commercially available product is also available as the dispersant, and specific examples thereof include Disperbyk series (for example, Disperbyk-111) manufactured by BYK Chemie, and Solsperse series (for example, Solsperse 76500) manufactured by Lubrizol Corporation. The dispersing agent described in paragraph Nos. 0041 to 0130 of JP2014-130338A can also be used, and the contents of which are incorporated herein by reference. The resin having an acid group and the like can also be used as the dispersant.

The content of the other resins is preferably 0.5% to 15% by mass with respect to the total solid content of the composition. The upper limit is preferably 13.5% by mass or less and more preferably 12% by mass or less. The lower limit is preferably 1.0% by mass or more and more preferably 1.5% by mass or more.

In addition, the content of the other resins is preferably 0.5 to 15 parts by mass with respect to 100 parts by mass of the compound (1). The upper limit is preferably 13.5 parts by mass or less and more preferably 12 parts by mass or less. The lower limit is preferably 1 part by mass or more and more preferably 1.5 parts by mass or more.

In addition, it is also possible that the composition according to the embodiment of the present invention does not contain the other resins substantially. The case where the composition according to the embodiment of the present invention does not contain the other resins substantially means that the content of the other resins in the total solid content of the composition according to the embodiment of the present invention is preferably 0.1% by mass or less, more preferably 0.05% by mass or less, and particularly preferably 0% by mass.

<<Solvent>>

The composition according to the embodiment of the present invention can contain a solvent. The solvent is preferably an organic solvent. The solvent is not particularly limited as long as it satisfies the solubility of the respective components or the coatability of the composition.

Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate. Examples of ketones include methyl ethyl ketone, cyclohexanone, cyclopentanone, 2-heptanone, and 3-heptanone. Suitable examples of aromatic hydrocarbons include toluene and xylene. In addition, 3-methoxy-N,N-dimethylpropanamide or 3-butoxy-N, N-dimethylpropanamide is also preferable from the viewpoint of improving the solubility. The organic solvents may be used singly or in combination of two or more kinds thereof.

In the present invention, a solvent having a low metal content is preferably used as the solvent. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015). Examples of a method of removing impurities such as a metal from the solvent include distillation (for example, molecular distillation and thin-film distillation) and filtration using a filter. The filter pore size of a filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers or a plurality of isomers may be included.

In the organic solvent used in the present invention, the content of a peroxide is preferably 0.8 mmol/L or less, and it is more preferable that the organic solvent does not substantially contain the peroxide.

The content of the solvent is preferably an amount such that the concentration of solid contents (total solid content) of the composition is 5% to 50% by mass. The upper limit is preferably 45% by mass or less and more preferably 40% by mass or less. The lower limit is preferably 8% by mass or more and more preferably 10% by mass or more.

In addition, from the viewpoint of environmental regulation, it is preferable that the composition according to the embodiment of the present invention does not contain environmentally regulated substances substantially. In the present invention, the description "does not contain environmentally regulated substances substantially" means that the content of the environmentally regulated substances in the composition is 50 ppm by mass or less, preferably 30 ppm by mass or less, still more preferably 10 ppm by mass or less, and particularly preferably 1 ppm by mass or less. Examples of the environmentally regulated substances include alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the composition according to the embodiment of the present invention, and may be incorporated into the composition as a residual solvent. From the viewpoint of human safety and environmental considerations, it is preferable to reduce these substances as much as preferable. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to prevent the radical polymerization reaction from proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, or composition produced by mixing these compounds.

<<Compound Having Epoxy Group>>

The composition according to the embodiment of the present invention can contain a compound (hereinafter, also referred to as an epoxy compound) having an epoxy group. The epoxy compound is preferably a compound having 1 to 100 epoxy groups in one molecule. The lower limit of the epoxy group is more preferably 2 or more. The upper limit of the epoxy group may be, for example, 10 or less, or may be 5 or less.

In the epoxy compound, the epoxy equivalent (=molecular weight of epoxy compound/number of epoxy groups) is preferably 500 g/equivalent or less, more preferably 100 to 400 g/equivalent, and still more preferably 100 to 300 g/equivalent.

The epoxy compound may be either a low-molecular-weight compound (for example, a molecular weight of less than 1000) or a high-molecular-weight compound (macromolecule) (for example, a molecular weight of 1000 or more, and in a case of a polymer, a weight-average molecular weight of 1000 or more). The weight-average molecular weight of the epoxy compound is preferably 200 to 100000 and more preferably 500 to 50000. The upper limit of the weight-average molecular weight is still more preferably 10000 or less, even more preferably 5000 or less, and still even more preferably 3000 or less.

Examples of a commercially available product of the epoxy compound include EHPE3150 (manufactured by Daicel Corporation). As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference.

In a case where the composition according to the embodiment of the present invention contains an epoxy compound, the content of the epoxy compound is preferably 0.1% to 40% by mass with respect to the total solid content of the composition. The lower limit is preferably 0.5% by mass or more and more preferably 1% by mass or more. The upper limit is preferably 30% by mass or less and more preferably 20% by mass or less. The composition according to the embodiment of the present invention may include only one kind or two or more kinds of the epoxy compounds. In a case where two or more kinds of the epoxy compounds are included, the total amount thereof is preferably within the range.

<<Curing Accelerator>>

The composition according to the embodiment of the present invention may include a curing accelerator for the purpose of improving the hardness of a pattern or lowering a curing temperature. Examples of the curing accelerator include a polyfunctional thiol compound having two or more thiol (SH) groups in one molecule. The polyfunctional thiol compound may also be added for the purpose of alleviating problems in stability, odor, resolution, developability, adhesiveness, or the like. The polyfunctional thiol compound is preferably secondary alkanethiols. Moreover, as the curing accelerator, a methylol-based compound (for example, the compounds exemplified as a crosslinking agent in paragraph No. 0246 of JP2015-034963A), amines, phosphonium salts, amidine salts, and amide compounds (each of which are the curing agents described in, for example, paragraph No. 0186 of JP2013-041165A), base generators (for example, the ionic compounds described in JP2014-055114A), isocyanate compounds (for example, the compounds described in paragraph No. 0071 of JP2012-150180A), alkoxysilane compounds (for example, the alkoxysilane compounds having an epoxy group, described in JP2011-253054A), onium salt compounds (for example, the compounds exemplified as an acid generator in paragraph No. 0216 of JP2015-034963A, and the compounds described in JP2009-180949A), or the like can be used. In a case where the composition according to the embodiment of the present invention contains a curing accelerator, the content of the curing accelerator is preferably 0.3% to 8.9% by mass and more preferably 0.8% to 6.4% by mass with respect to the total solid content of the composition. The composition according to the embodiment of the present invention may include only one kind or two or more kinds of the curing accelerators. In a case where two or more kinds of the curing accelerators are included, the total amount thereof is preferably within the range.

<<Pigment Derivative>>

The composition according to the embodiment of the present invention preferably contains a pigment derivative. Examples of the pigment derivative include a compound having a structure in which a part of a chromophore is substituted with an acid group, a basic group, or a phthalimidemethyl group.

Examples of the chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, the quinoline-based skeleton, the benzimidazolone-based skeleton, the diketopyrrolopyrrole-based skeleton, the azo-based skeleton, the quinophthalone-based skeleton, the isoindoline-based skeleton, and the phthalocyanine-based skeleton are preferable, and the azo-based skeleton and the benzimidazolone-based skeleton are more preferable. As the acid group contained in the pigment derivative, a sulfo group or a carboxyl group is preferable and the sulfo group is more preferable. As the basic group contained in the pigment derivative, an amino group is preferable and a tertiary amino group is more preferable. With regard to specific examples of the pigment derivative, reference can be made to the description in paragraph Nos. 0162 to 0183 of JP2011-252065A, and the contents thereof are incorporated herein by reference.

In a case where the composition according to the embodiment of the present invention contains a pigment derivative, the content of the pigment derivative is preferably 1 to 30 parts by mass, and more preferably 3 to 20 parts by mass with respect to 100 parts by mass of the pigment. The pigment derivative may be used singly or in combination of two or more kinds thereof. The composition according to the embodiment of the present invention may include only one kind or two or more kinds of the pigment derivatives. In a case where two or more kinds of the pigment derivatives are included, the total amount thereof is preferably within the range.

<<Surfactant>>

The composition according to the embodiment of the present invention can contain a surfactant. With regard to the surfactant, reference can be made to the description in paragraph Nos. 0238 to 0245 of WO2015/166779A, and the contents of which are incorporated herein by reference. Examples of the surfactant include a fluorine-based surfactant, a nonionic surfactant, a cationic surfactant, an anionic surfactant, and a silicone-based surfactant, and a fluorine-based surfactant is preferable. In a case where the composition according to the embodiment of the present invention contains the fluorine-based surfactant, liquid characteristics (particularly fluidity) are improved and liquid saving properties can be further improved. In addition, a film with small thickness unevenness can be formed.

The fluorine content in the fluorine-based surfactant is preferably 3% to 40% by mass, more preferably 5% to 30% by mass, and still more preferably 7% to 25% by mass. The fluorine-based surfactant in which the fluorine content is within the above-described range is effective in terms of the evenness of the thickness of the coating film or liquid saving properties.

Examples of the fluorine-based surfactant include surfactants described in paragraph Nos. 0060 to 0064 of JP2014-041318A (paragraph Nos. 0060 to 0064 of the corresponding WO2014/017669A) and surfactants described in paragraph Nos. 0117 to 0132 of JP2011-132503A. In addition, examples of a commercially available product of the fluorine-based surfactant include MEGAFACE F171, F172, F173, F176, F177, F141, F142, F143, F144, R30, F437, F475, F479, F482, F554, F780, EXP, and MFS-330 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and KH-40 (all manufactured by Asahi Glass Co., Ltd.), and PolyFox PF636, PF656, PF6320, PF6520, and PF7002 (all manufactured by OMNOVA).

In addition, as the fluorine-based surfactant, an acrylic compound which has a molecular structure having a functional group containing a fluorine atom and in which, by applying heat to the molecular structure, the functional group containing a fluorine atom is broken to volatilize a fluorine atom can be used. Examples of such a fluorine-based surfactant include MEGAFACE DS series manufactured by DIC Corporation (for example, MEGAFACE DS-21).

In addition, as the fluorine-based surfactant, a copolymer of a fluorine atom-containing vinyl ether compound having a fluorinated alkyl group or a fluorinated alkylene ether group and a hydrophilic vinyl ether compound can be used. With regard to such a fluorine-based surfactant, reference can be made to the description in JP2016-216602A, the contents of which are incorporated herein by reference.

A block polymer can be used as the fluorine-based surfactant. Examples of the block polymer include the compounds described in JP2011-089090A. In addition, as the fluorine-based surfactant, a fluorine-containing copolymer including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can be used. The following compounds are also exemplified as a fluorine-based surfactant for use in the present invention.

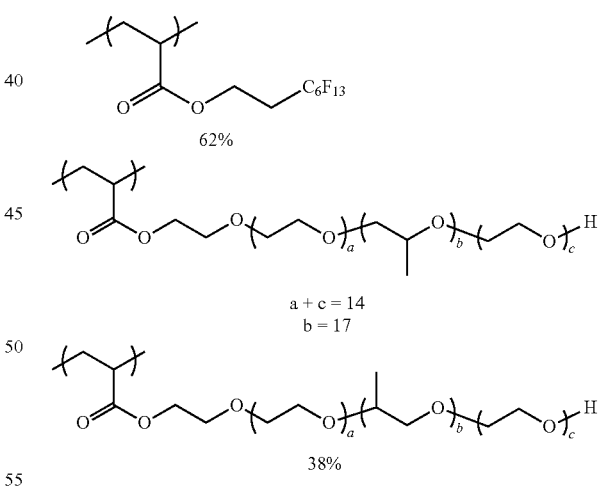

The weight-average molecular weight of the compounds is preferably 3,000 to 50,000, and is, for example, 14,000. In the above compounds, % representing the proportion of the repeating unit is % by mole.

In addition, as the fluorine-based surfactant, a fluorine-containing copolymer including a repeating unit having an ethylenically unsaturated bonding group in the side chain can be used. Specific examples thereof include the compounds described in paragraph Nos. 0050 to 0090 and paragraph Nos. 0289 to 0295 of JP2010-164965A, and MEGAFACE RS-101, RS-102, RS-718K, and RS-72-K manufactured by DIC Corporation. In addition, as the fluorine-based surfactant, the compounds described in paragraph Nos. 0015 to 0158 of JP2015-117327A can be used.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin Chemical Industry Co., Ltd.).

The content of the surfactant is preferably 0.001% to 5.0% by mass and more preferably 0.005% to 3.0% by mass with respect to the total solid content of the composition. The composition according to the embodiment of the present invention may include only one kind or two or more kinds of the surfactants. In a case where two or more kinds of the surfactants are included, the total amount thereof is preferably within the range.

<<Silane Coupling Agent>>

The composition according to the embodiment of the present invention can contain a silane coupling agent. In the present invention, the silane coupling agent means a silane compound having a hydrolyzable group and another functional group. Further, the hydrolyzable group refers to a substituent that can be directly bonded to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a styrene group, a methacryl group, an amino group, an isocyanurate group, a ureido group, a mercapto group, a sulfide group, or an isocyanate group, and an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the description in paragraph Nos. 0155 to 0158 of JP2013-254047A, and the contents of which are incorporated herein by reference.

In a case where the composition according to the embodiment of the present invention contains a silane coupling agent, the content of the silane coupling agent is preferably 0.001% to 20% by mass, more preferably 0.01% to 10% by mass, and still more preferably 0.1% to 5% by mass with respect to the total solid content of the composition. The composition according to the embodiment of the present invention may include one kind or two or more kinds of the silane coupling agents. In a case where the composition includes two or more kinds of the silane coupling agents, the total amount thereof is preferably within the range.

<<Polymerization Inhibitor>>

The composition according to the embodiment of the present invention can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), an N-nitrosophenylhydroxyamine salt (an ammonium salt, a cerous salt, or the like), and 2,2,6,6-tetramethylpiperidine 1-oxyl. In a case where the composition according to the embodiment of the present invention contains a polymerization inhibitor, the content of the polymerization inhibitor is preferably 0.0001% to 5% by mass with respect to the total solid content of the composition. The composition according to the embodiment of the present invention may include one kind or two or more kinds of the polymerization inhibitors. In a case of including two or more kinds of the polymerization inhibitors, the total amount thereof is preferably within the above-described range.

<<Ultraviolet Absorber>>

The composition according to the embodiment of the present invention can contain an ultraviolet absorber. Examples of the ultraviolet absorber include a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, and a triazine compound. With regard to details thereof, reference can be made to the description in paragraph Nos. 0052 to 0072 of JP2012-208374A, paragraph Nos. 0317 to 0334 of JP2013-068814A, and paragraph Nos. 0061 to 0080 of JP2016-162946A, and the contents of which are incorporated herein by reference. Specific examples of the ultraviolet absorber include a compound having the following structure. Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016).

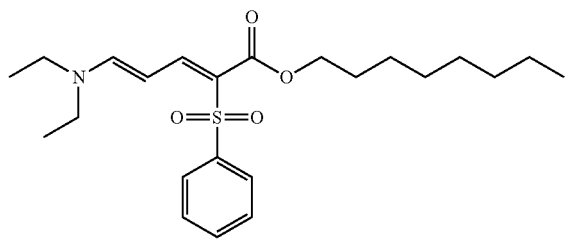 [SMILES: CCCCCCCCOC(=O)/C(=C/C=C/N(CC)CC)S(=O)(=O)c1ccccc1]

In a case where the composition according to the embodiment of the present invention contains an ultraviolet absorber, the content of the ultraviolet absorber is preferably 0.1% to 10% by mass, more preferably 0.1% to 5% by mass, and particularly preferably 0.1% to 3% by mass with respect to the total solid content of the composition. Further, the ultraviolet absorber may be used singly or in combination of two or more kinds thereof. In a case where two or more kinds of the ultraviolet absorbers are included, the total amount thereof is preferably within the range.

<<Other Additives>>

Various additives such as a filler, an adhesion promoter, an antioxidant, a potential antioxidant, and an aggregation inhibitor can be blended into the composition according to the embodiment of the present invention as necessary. Examples of these additives include the additives described in paragraph Nos. 0155 and 0156 of JP2004-295116A, and the contents of which are incorporated herein by reference. In addition, examples of the antioxidant include a phenol compound, a phosphorus-based compound (for example, the compounds described in paragraph No. 0042 of JP2011-090147A), a thioether compound. Examples of a commercially available product of the antioxidant include ADEKA STAB series (AO-20, AO-30, AO-40, AO-50, AO-50F, AO-60, AO-60G, AO-80, AO-330, and the like) manufactured by ADEKA Corporation. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or basic catalyst and the compound functions as an antioxidant. Examples of the potential antioxidant include the compounds described in WO2014/021023A, WO2017/030005A, and JP2017-008219A. Examples of a commercially available product of the potential antioxidant include ADEKA ARKLS GPA-5001 (manufactured by ADEKA Corporation).

There are some cases where a metal element is included in the composition according to raw materials and the like, but from the viewpoint of suppression of generation of defects, or the like, the content of Group 2 elements (calcium, magnesium, and the like) in the composition is preferably 50 ppm by mass or less, and more preferably 0.01 to 10 ppm by mass. Further, the total amount of the inorganic metal salts in the composition is preferably 100 ppm by mass or less and more preferably 0.5 to 50 ppm by mass.

The moisture content in the composition according to the embodiment of the present invention is preferably 3% by mass or less, more preferably 0.01% to 1.5% by mass, and still more preferably 0.1% to 1.0% by mass. The moisture content can be measured by a Karl Fischer method.

The composition according to the embodiment of the present invention can be used after viscosity is adjusted for the purposes of adjusting the state of a film surface (flatness or the like), adjusting a film thickness, or the like. The value of the viscosity can be appropriately selected as desired, and is, for example, preferably 0.3 to 50 mPa×s, and more preferably 0.5 to 20 mPa×s at 25° C. The viscosity of the composition can be measured using an E-type viscometer (R85 type, manufactured by Toki Sangyo Co., Ltd.) in accordance with the test method described in JISK5101-6-2: 2004, in a state adjusted to a temperature of 25° C.

A storage container for the composition according to the embodiment of the present invention is not particularly limited, and a known storage container can be used. Further, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or compositions. Examples of such a container include the containers described in JP2015-123351A.

In a case where the composition according to the embodiment of the present invention is used as a color filter in applications for a liquid crystal display device, the voltage holding ratio of a liquid crystal display element comprising a color filter is preferably 70% or more, and more preferably 90% or more. Known means for obtaining a high voltage holding ratio can be incorporated as appropriate, and examples of typical means include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

<Method for Preparing Composition>

The composition according to the embodiment of the present invention can be prepared by mixing the above-described components. In the preparation of the composition, all the components may be dissolved and/or dispersed at the same time in a solvent to prepare the composition, or the respective components may be appropriately left in two or more solutions or dispersion liquids and mixed to prepare the composition upon use (during coating), as desired.

In addition, in the preparation of the composition, a process for dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that, in the preparation of the composition, the composition is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high-density or an ultrahigh molecular weight) such as polyethylene and polypropylene (PP). Among these materials, polypropylene (including a high-density polypropylene) and nylon are preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be more reliably removed. With regard to the pore size value of the filter, reference can be made to a nominal value of filter manufacturers. As the filter, various filters provided by Nihon Pall Corporation (DFA4201NIEY and the like), Toyo Roshi Kaisha, Ltd., Nihon Entegris K.K. (formerly Nippon Microlith Co., Ltd.), Kitz Micro Filter Corporation, and the like can be used.

In addition, a fibrous filter material is also preferably used as the filter. Examples of the fibrous filter material include a polypropylene fiber, a nylon fiber, and a glass fiber. Examples of a commercially available product thereof include SBP type series (SBP008 and the like), TPR type series (TPR002, TPR005, and the like), and SHPX type series (SHPX003 and the like) manufactured by Roki Techno Co., Ltd.

In a case of using a filter, different filters (for example, a first filter and a second filter) may be combined. Here, the filtration with each of the filters may be performed once or may be performed twice or more times. In addition, filters having different pore sizes within the above-described range may be combined. In addition, the filtration through the first filter may be performed only a dispersion liquid, the other components may be mixed therewith, and then the filtration through the second filter may be performed.

<Film>

The film according to an embodiment of the present invention is a film obtained from the composition according to the embodiment of the present invention. The film according to the embodiment of the present invention can be used for a color filter, an infrared transmission filter, a near-infrared cut filter, a black matrix, a light-shielding film, a refractive index adjusting film, and the like. For example, the film according to an embodiment of the present invention can be preferably used as a colored layer of a color filter.

The film thickness can be appropriately adjusted depending on purposes. For example, the film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more.

<Method for Producing Film>

In addition, the film according to the embodiment of the present invention can be produced through a step of applying the composition according to the embodiment of the present invention on a support. The production method of the film of the embodiment of the present invention preferably further includes a step of forming a pattern. Examples of a method for forming the pattern include a photolithography method and a dry etching method, and a photolithography method is preferable.

Pattern formation by the photolithography method preferably includes a step of forming a composition layer on a support using the composition according to the embodiment of the present invention, a step of patternwise exposing the composition layer, and a step of removing an unexposed area of the composition layer by development to form a pattern. A step of baking the composition layer (pre-baking step) and a step of baking the developed pattern (post-baking step) may be provided, as desired. In addition, pattern formation by the dry etching method preferably includes a step of forming a composition layer on a support with the composition, and curing the composition layer to form a cured product layer, a step of forming a resist layer on the cured product layer, a step of obtaining a resist pattern by patterning the resist layer, and a step of subjecting the cured product layer to dry etching with the resist pattern as an etching mask to form a pattern. Hereinafter, the respective steps will be described.

<<Step of Forming Composition Layer>>

In the step of forming a composition layer, the composition layer is formed on a support, using the composition according to the embodiment of the present invention. The support is not particularly limited, and can be appropriately selected depending on applications. Examples of the support include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of substances, or planarize the surface of the substrate.

As a method for applying the composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprint method. An application method of the ink jet is not particularly limited, and examples thereof include a method (particularly pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A. In addition, with regard to the method for applying the composition, reference can be made to the description in WO2017/030174A and WO2017/018419A, and the contents of which are incorporated herein by reference.

The composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. Pre-baking can be performed using a hot plate, an oven, or the like.

(Case of Forming Pattern by Photolithography Method)

<<Exposing Step>>

Next, the composition layer formed on the support is patternwise exposed (exposing step). For example, the composition layer can be subjected to patternwise exposure by performing exposure using a stepper exposure machine or a scanner exposure machine through a mask having a predetermined mask pattern. Thus, the exposed portion can be cured. Examples of the radiation (light) which can be used during the exposure include g-rays and i-rays. In addition, light (preferably light with a wavelength of 180 to 300 nm) with a wavelength of 300 nm or less can be used. Examples of the light with a wavelength of 300 nm or less include KrF-rays (wavelength 248 nm) and ArF-rays (wavelength 193 nm), and KrF-rays (wavelength 248 nm) are preferable.

The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

<<Developing Step>>

Next, the unexposed areas of the composition layer are removed by development to form a pattern. The removal of the unexposed areas of the composition layer by development can be carried out using a developer. Thus, the composition layer of the unexposed areas in the exposing step is eluted into the developer, and as a result, only a photocured portion remains. As the developer, an organic alkali developer causing no damage on a base of element, circuit, or the like is desirable. The temperature of the developer is preferably, for example, 20° C. to 30° C. The development time is preferably 20 to 180 seconds. Further, in order to improve residue removing properties, a step of removing the developer by shaking per 60 seconds and supplying a fresh developer may be repeated multiple times.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass and more preferably 0.01% to 1% by mass. Moreover, the developer may further include a surfactant. Examples of the surfactant include the surfactants described above, and the surfactant is preferably a nonionic surfactant. From the viewpoints of transportation, storage, and the like, the developer may be first produced as a concentrated liquid and then diluted to a concentration required upon the use. The dilution ratio is not particularly limited, and can be set to, for example, a range of 1.5 to 100 times. In addition, in a case where a developer consisting of such an aqueous alkaline solution is used, it is preferable to perform washing (rinsing) with pure water after development.

After the development, it is preferable that a heating treatment (post-baking) after carrying out drying. The post-baking is a heating treatment after development in order to complete curing, and the heating temperature is preferably, for example, 100° C. to 240° C. and more preferably 200° C. to 240° C. The post-baking can be performed continuously or batchwise by using a heating unit such as a hot plate, a convection oven (hot-air circulating dryer), and a high-frequency heater so that the film after development satisfies the conditions. It is preferable that the film after post-baking has Young's modulus of 0.5 to 20 GPa, and it is more preferable that the film after post-baking has Young's modulus of 2.5 to 15 GPa.

The film preferably has high flatness. Specifically, the surface roughness Ra is preferably 100 nm or less, more preferably 40 nm or less, and still more preferably 15 nm or less. The lower limit is not specified, but is preferably, for example, 0.1 nm or more. The surface roughness can be measured, for example, using an atomic force microscope (AFM) Dimension 3100 manufactured by Veeco Instruments, Inc.

In addition, the contact angle of water on the film can be appropriately set to a preferred value and is typically in the range of 50 to 1100. The contact angle can be measured, for example, using a contact angle meter CV-DT-A Model (manufactured by Kyowa Interface Science Co., Ltd.).

A higher volume resistivity value of each pattern (pixel) is desired. Specifically, the volume resistivity value of the pixel is preferably $10^9 \Omega \times$ cm or more and more preferably $10^{11} \Omega \times$ cm or more. The upper limit is not specified, but is, for example, preferably $10^{14} \Omega \times$ cm or less. The volume resistivity value of the pixel can be measured, for example, using an ultra-high resistance meter 5410 (manufactured by Advantest Corporation).

(Case of Forming Pattern by Dry Etching Method)

Pattern formation by the dry etching method can be performed by a method in which a composition layer formed by applying the composition according to the embodiment of the present invention onto a support is cured to form a cured product layer, a patterned resist layer is then formed on the cured product layer, and the cured product layer is then dry-etched with an etching gas using the patterned resist layer as a mask. It is preferable that a positive type or negative type photosensitive composition is applied onto a cured product layer, and dried to form a resist layer. As the composition used for formation of the resist layer, a positive type photosensitive composition is preferable. As the positive type photosensitive composition, a photosensitive composition which is sensitive to radiations such as ultraviolet rays (g-rays, h-rays, and i-rays), far ultraviolet rays including KrF-rays, ArF-rays, and the like, electron beams, ion beams, and X-rays is preferable. The above-described positive type photosensitive composition is preferably a photosensitive composition which is sensitive to KrF-rays, ArF-rays, i-rays, and X-rays, and from the viewpoint of micromachining, a photosensitive composition which is sensitive to KrF-rays is more preferable. As the positive type photosensitive composition, the positive type resist compositions described in JP2009-237173A or JP2010-134283A are suitably used.

<Color Filter>

Next, the color filter according to an embodiment of the present invention will be described. The color filter according to the embodiment of the present invention has the film of the embodiment of the present invention. In a case where the film according to the embodiment of the present invention is used for a color filter, as the pigment, it is preferable to a pigment having a maximum absorption wavelength in a range of 400 to 700 nm. In the color filter according to the embodiment of the present invention, the film thickness of the film according to the embodiment of the present invention can be appropriately adjusted depending on the purposes. The film thickness is preferably 20 m or less, more preferably 10 m or less, and still more preferably 5 m or less. The lower limit of the film thickness is preferably 0.1 m or more, more preferably 0.2 m or more, and still more preferably 0.3 rpm or more. The color filter according to the embodiment of the present invention can be used for a solid-state imaging element such as a charge coupled device (CCD) and a complementary metal-oxide semiconductor (CMOS), an image display device, or the like.

<Solid-State Imaging Element>

The solid-state imaging element according to an embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and function as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode consisting of polysilicon or the like on a substrate; have a light-shielding film having openings only over the light receiving section of the photodiodes on the photodiodes and the transfer electrodes; have a device-protective film consisting of silicon nitride or the like, which is formed to coat the entire surface of the light-shielding film and the light receiving section of the photodiodes, on the light-shielding film; and have a color filter on the device-protective film. In addition, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each coloring pixel is embedded in a space partitioned in, for example, a lattice shape by a partition wall. The partition wall in this case preferably has a low refractive index for each coloring pixel. Examples of an imaging device having such a structure include the devices described in JP2012-227478A and JP2014-179577A. An imaging device comprising the solid-state imaging element according to the embodiment of the present invention can also be used as a vehicle camera or a monitoring camera, in addition to a digital camera or electronic equipment (mobile phones or the like) having an imaging function.

<Image Display Device>

The image display device according to an embodiment of the present invention has the film according to the embodiment of the present invention. Examples of the image display device include a liquid crystal display device or an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. In addition, "parts" and "%" are on a mass basis unless otherwise specified.

<Measurement of Weight-average molecular weight (Mw) and Number-average molecular weight (Mn)>

The weight-average molecular weight (Mw) and number-average molecular weight (Mn) of a measurement sample was measured by gel permeation chromatography (GPC) according to the following conditions.

Types of columns: columns formed by connection of TOSOH TSKgel Super HZM-H, TOSOH TSKgel Super HZ4000, and TOSOH TSKgel Super HZ2000

Developing solvent: tetrahydrofuran

Column temperature: 40° C.

Flow amount (amount of a sample to be injected): 1.0 μL (sample concentration: 0.1% by mass)

Device name: HLC-8220GPC manufactured by Tosoh Corporation

Detector: refractive index (RI) detector

Calibration curve base resin: polystyrene resin

<Method for Measuring Acid Value>

The measurement sample was dissolved in a mixed solvent of tetrahydrofuran/water=9/1 (mass ratio), and the obtained solution was subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A = 56.11 \times Vs \times 0.5 \times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the measurement sample (expressed in terms of solid contents)

<Measurement of C═C Value>

The C═C value of the compound (1) was calculated from a raw material used for the synthesis of the compound (1).

<Measurement of Viscosity>

The viscosity of the measurement sample was measured using an E-type viscometer (R85 type, manufactured by Toki Sangyo Co., Ltd.) in accordance with the test method described in JISK5101-6-2: 2004, in a state where a temperature of the measurement sample was adjusted to 25° C.

<Measurement of Reduced Viscosity>

3.33 g (1 g as a solid content) of a 30% by mass N-methylpyrrolidone solution of the measurement sample was weighed into a 20 ml of volumetric flask and was diluted in the volumetric flask by N-methylpyrrolidone. The solution was allowed to stand in a constant-temperature tank at 30° C. for 30 minutes, and placed in an Ubbelohde reduced viscosity tube (viscometer constant=0.010 cSt/s) to measure a time required to flow down at 30° C. The measurement was performed twice with the same sample, and the average value of the measurement was calculated. The same measurement was performed in a case of a blank (only N-methylpyrrolidone). The reduced viscosity (ml/g) was calculated from the following equation.

Reduced Viscosity (ml/g)={(Flow Time of Sample Solution (second)−Flow Time of Blank (second))/Flow Time of Blank (second)}/{(3.33× 0.3)/20}

Synthesis of Compound (1)

Synthesis of P-1

Propylene glycol monomethyl ether acetate (PGMEA) was added to a mixed solution of 9.05 parts by mass of a polyfunctional thiol compound (compound S-1 having the following structure) and 90.95 parts by mass of a macromonomer (compound MM-1 having the following structure, Mw=3000) so as to adjust the concentration of solid contents to 63% by mass, and then the mixed solution was heated to 75° C. under a nitrogen stream. Next, 0.4 parts by mass of dimethyl 2,2'-azobis(isobutyrate) (V-601, manufactured by Wako Pure Chemical Industries, Ltd.) was added to the mixed solution and the mixed solution was heated for 2 hours, and then 0.4 parts by mass of dimethyl 2,2'-azobis (isobutyrate) was added to the mixed solution again and the mixed solution was reacted at 90° C. for 2 hours under a nitrogen stream. Thereafter, the mixed solution was cooled to room temperature (25° C., the same applies hereinafter).

Next, a mixed solution of 76.93 parts by mass of the obtained reaction product and 23.06 parts by mass of a monomer having an ethylenically unsaturated bonding group (compound m-1 having the following structure) was heated to 75° C. under a nitrogen stream. Next, 0.4 parts by mass of dimethyl 2,2'-azobis(isobutyrate) was added to the mixed solution and the mixed solution was heated for 2 hours, and then 0.4 parts by mass of dimethyl 2,2'-azobis (isobutyrate) was added to the mixed solution again and the mixed solution was reacted at 90° C. for 2 hours under a nitrogen stream. After cooling the mixed solution to room temperature, PGMEA was added thereto so as to adjust the concentration of solid contents to 30% by mass, thereby obtaining a 30% by mass PGMEA solution of P-1. The weight-average molecular weight (Mw) of P-1 was 11,000, the dispersity (Mw/Mn) was 1.8, the acid value was 75 mgKOH/g, and the reduced viscosity was 11 ml/gs.

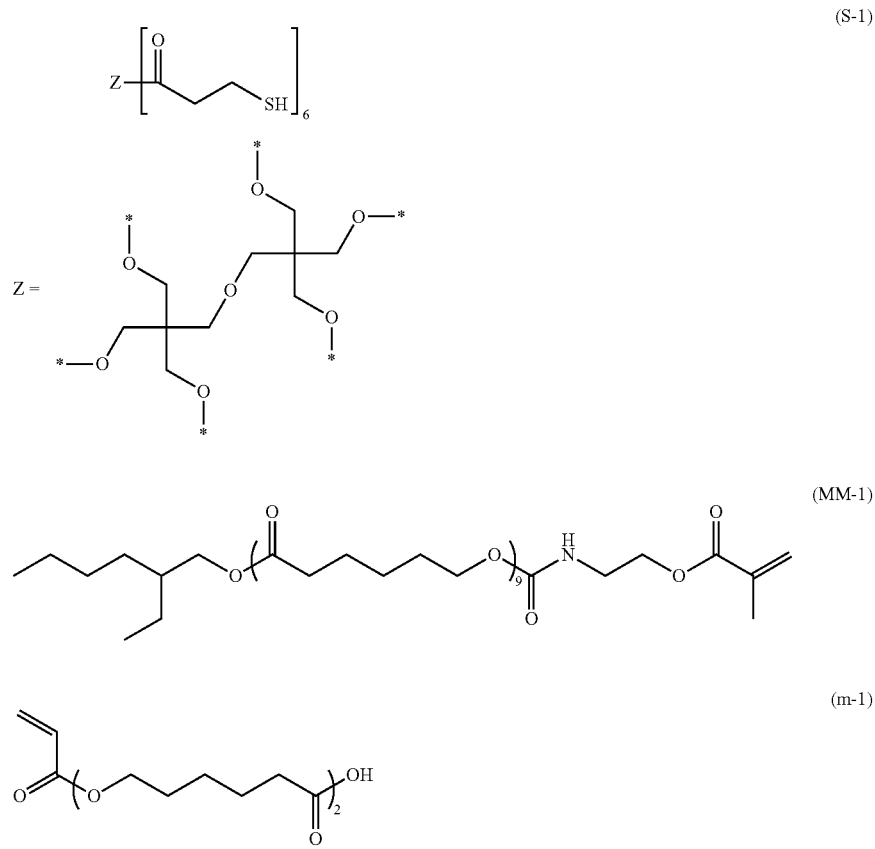

Synthesis of P-2 to P-17
P-2 to P-17 were synthesized in the same manner as P-1, except that the types of the macromonomer and the monomer having an ethylenically unsaturated bonding group were changed, and PGMEA was thereto so as to adjust the concentration of solid contents to 30% by mass, thereby obtaining 30% by mass PGMEA solutions of P-2 to P-17.
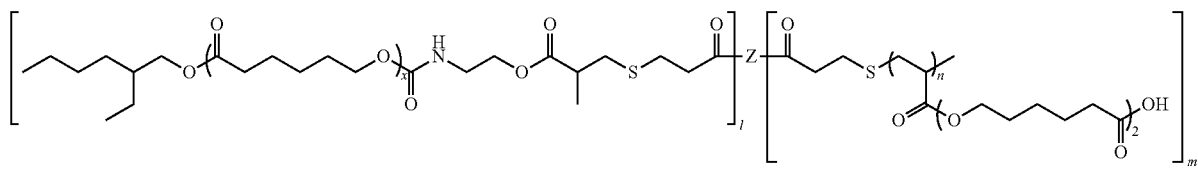
(P-1), ((P-7), (P-8), (P-9)
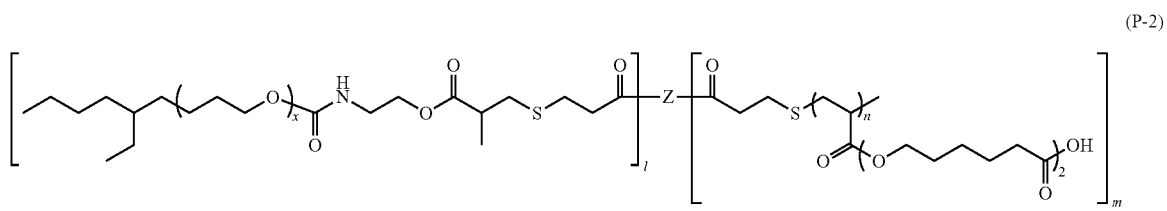
(P-2)
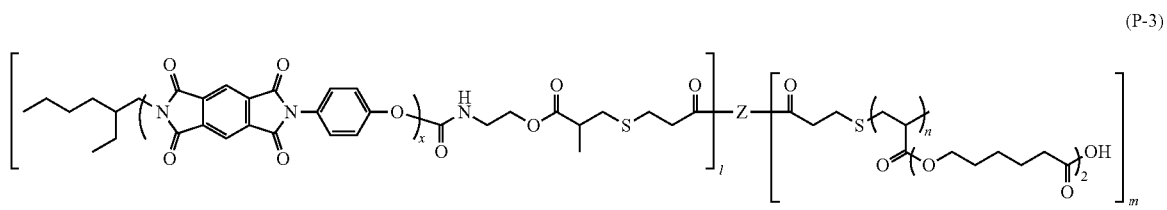
(P-3)
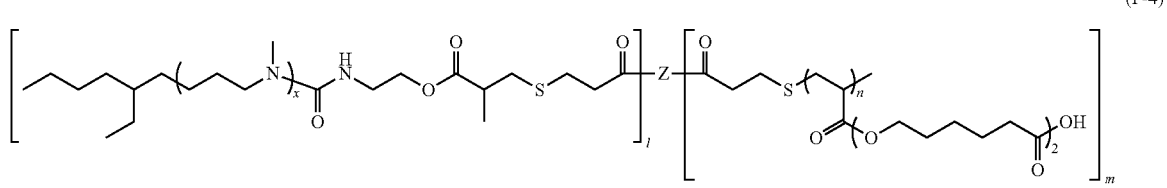
(P-4)
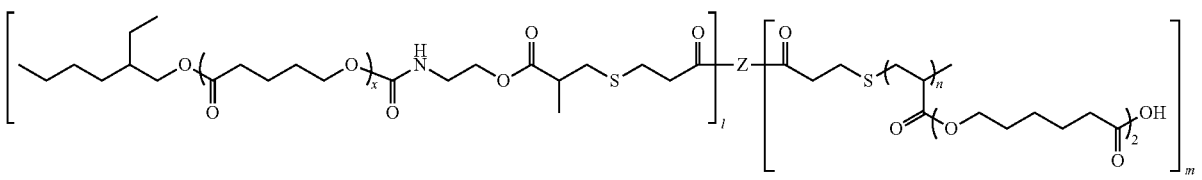
(P-5)
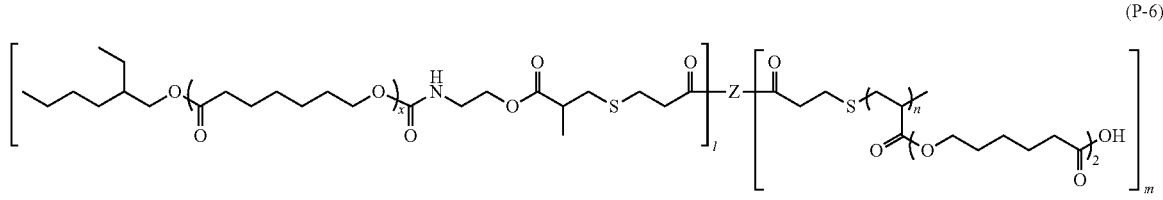
(P-6)

-continued
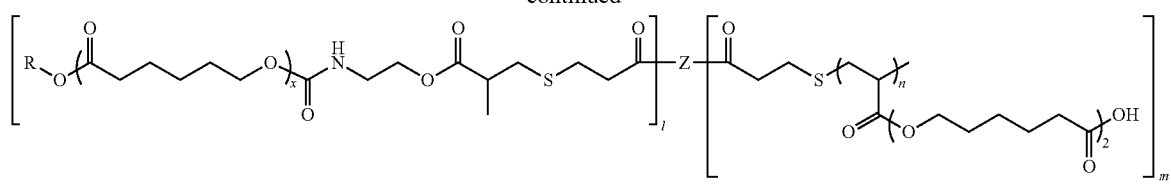
R =
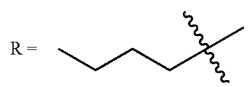
(P-10)          (P-11)
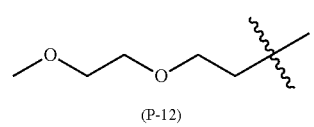
(P-12)
(P-13)
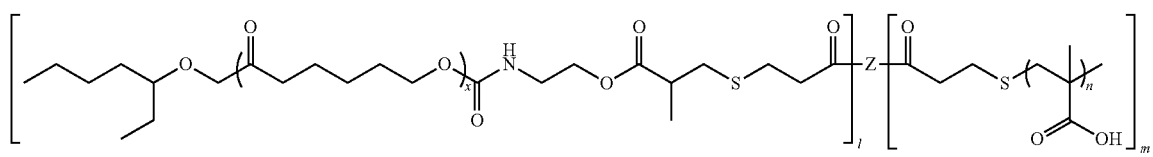
(P-14)
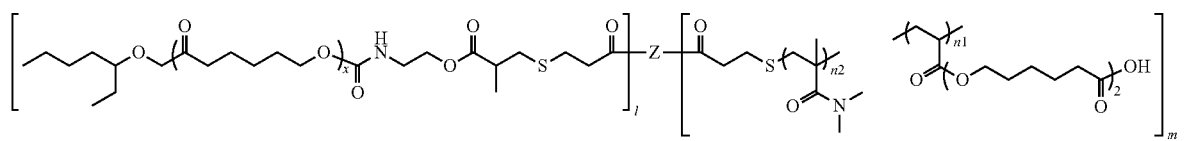
(P-15)
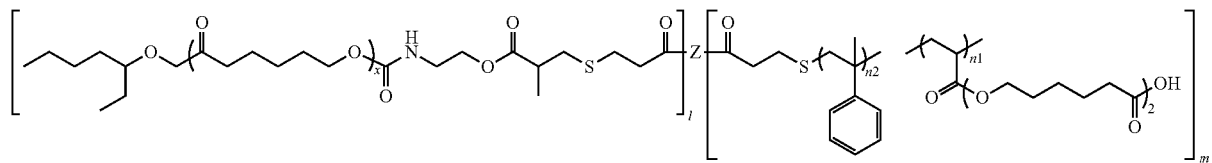
(P-16)
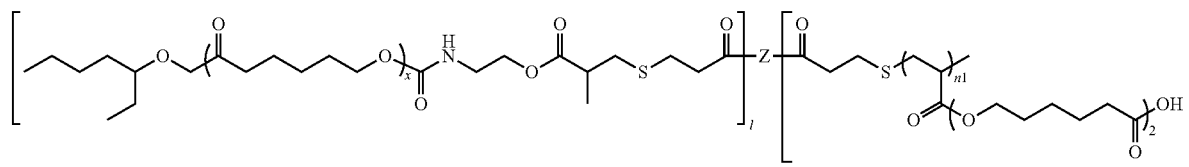
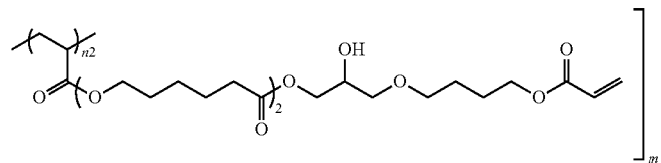

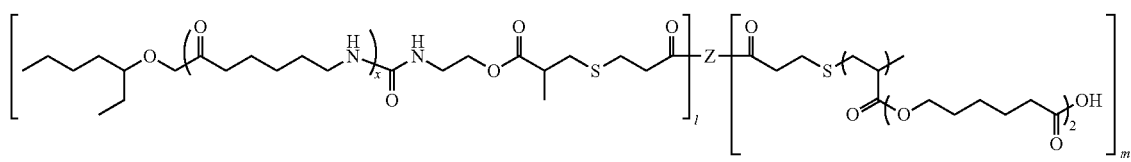
(P-17)

In the above structural formulae, Z is the following group.

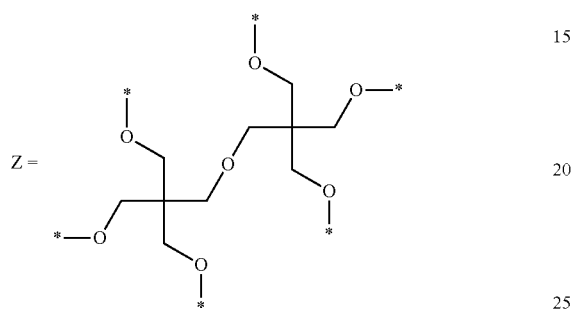

TABLE 1

| | Mw of macromonomer used (corresponding to Mw of polymer chain P¹) | | | | Physical properties of dispersed resin | | | | |
|---|---|---|---|---|---|---|---|---|---|
| | x | chain P¹) | l | m | n | C=C value (mmol/g) | Acid value (mgKOH/g) | Mw | Dispersity | Reduced viscosity (ml/g) |
| P-1 | 9 | 3000 | 3 | 3 | 3.52 | 0 | 75 | 11000 | 1.80 | 11.0 |
| P-2 | 9 | 3000 | 3 | 3 | 3.52 | 0 | 75 | 11000 | 1.80 | 11.0 |
| P-3 | 9 | 3000 | 3 | 3 | 3.52 | 0 | 75 | 11000 | 1.80 | 11.0 |
| P-4 | 9 | 3000 | 3 | 3 | 3.52 | 0 | 75 | 11000 | 1.80 | 11.0 |
| P-5 | 9 | 3000 | 2 | 4 | 1.94 | 0 | 75 | 9000 | 1.65 | 11.0 |
| P-6 | 9 | 3000 | 4 | 2 | 6.86 | 0 | 75 | 13000 | 2.15 | 11.0 |
| P-7 | 20 | 6000 | 3 | 3 | 3.52 | 0 | 75 | 12000 | 1.95 | 16.5 |
| P-8 | 40 | 9000 | 3 | 3 | 3.52 | 0 | 75 | 13500 | 2.05 | 17.5 |
| P-9 | 60 | 12000 | 3 | 3 | 3.52 | 0 | 75 | 15000 | 2.15 | 18.5 |
| P-10 | 9 | 3000 | 3 | 3 | 3.52 | 0 | 75 | 11000 | 1.80 | 11.0 |
| P-11 | 9 | 3000 | 3 | 3 | 3.52 | 0 | 75 | 11000 | 1.80 | 11.0 |
| P-12 | 9 | 3000 | 3 | 3 | 3.52 | 0 | 75 | 11000 | 1.80 | 11.0 |
| P-13 | 9 | 3000 | 3 | 3 | 2.38 | 0 | 75 | 10000 | 1.70 | 10.0 |
| P-14 | 9 | 3000 | 3 | 3 | n1 = 3.52 n2 = 7.82 | 0 | 75 | 11000 | 1.90 | 11.0 |
| P-15 | 9 | 3000 | 3 | 3 | n1 = 3.52 n2 = 7.44 | 0 | 75 | 11000 | 1.90 | 11.0 |
| P-16 | 9 | 3000 | 3 | 3 | n1 = 4.0 n2 = 1.1 | 0.24 | 75 | 11000 | 1.85 | 11.5 |
| P-17 | 9 | 3000 | 3 | 3 | 3.52 | 0 | 75 | 11000 | 1.80 | 11.0 |

Preparation of Dispersion Liquid (Dispersion Liquids 1 to 17, 21 to 31, R1 to R4)

Raw materials described in the following tables were mixed, and then 230 parts by mass of zirconia beads having a diameter of 0.3 mm were added thereto to perform a dispersion treatment for 5 hours using a paint shaker. The beads were separated by filtration, and a dispersion liquid was produced. The numerical values described in the following tables indicate parts by mass.

TABLE 2

| | Pigment | | Pigment derivative | | Dispersant | | Organic solvent | |
|---|---|---|---|---|---|---|---|---|
| | Type | Parts by mass | Type | Parts by mass | Type | Parts by mass | Type | Parts by mass |
| Dispersion liquid 1 | PR254 PY139 | 9.6 4.3 | Derivative 1 | 0.5 | P-1 | 20 | PGMEA | 79.3 |
| Dispersion liquid 2 | PR254 PY139 | 9.6 4.3 | Derivative 1 | 0.5 | P-2 | 20 | PGMEA | 79.3 |
| Dispersion liquid 3 | PR254 PY139 | 9.6 4.3 | Derivative 1 | 0.5 | P-3 | 20 | PGMEA | 79.3 |
| Dispersion liquid 4 | PR254 PY139 | 9.6 4.3 | Derivative 1 | 0.5 | P-4 | 20 | PGMEA | 79.3 |
| Dispersion liquid 5 | PR254 PY139 | 9.6 4.3 | Derivative 1 | 0.5 | P-5 | 20 | PGMEA | 79.3 |
| Dispersion liquid 6 | PR254 PY139 | 9.6 4.3 | Derivative 1 | 0.5 | P-6 | 20 | PGMEA | 79.3 |
| Dispersion liquid 7 | PR254 PY139 | 9.6 4.3 | Derivative 1 | 0.5 | P-7 | 20 | PGMEA | 79.3 |
| Dispersion liquid 8 | PR254 PY139 | 9.6 4.3 | Derivative 1 | 0.5 | P-8 | 20 | PGMEA | 79.3 |
| Dispersion liquid 9 | PR254 PY139 | 9.6 4.3 | Derivative 1 | 0.5 | P-9 | 20 | PGMEA | 79.3 |
| Dispersion liquid 10 | PR254 PY139 | 9.6 4.3 | Derivative 1 | 0.5 | P-10 | 20 | PGMEA | 79.3 |
| Dispersion liquid 11 | PR254 PY139 | 9.6 4.3 | Derivative 1 | 0.5 | P-11 | 20 | PGMEA | 79.3 |
| Dispersion liquid 12 | PR254 PY139 | 9.6 4.3 | Derivative 1 | 0.5 | P-12 | 20 | PGMEA | 79.3 |
| Dispersion liquid 13 | PR254 PY139 | 9.6 4.3 | Derivative 1 | 0.5 | P-13 | 20 | PGMEA | 79.3 |
| Dispersion liquid 14 | PR254 PY139 | 9.6 4.3 | Derivative 1 | 0.5 | P-14 | 20 | PGMEA | 79.3 |
| Dispersion liquid 15 | PR254 PY139 | 9.6 4.3 | Derivative 1 | 0.5 | P-15 | 20 | PGMEA | 79.3 |
| Dispersion liquid 16 | PR254 PY139 | 9.6 4.3 | Derivative 1 | 0.5 | P-16 | 20 | PGMEA | 79.3 |
| Dispersion liquid 17 | PR254 PY139 | 9.6 4.3 | Derivative 1 | 0.5 | P-17 | 20 | PGMEA | 79.3 |

TABLE 3

| | Pigment | | Pigment derivative | | Dispersant | | Organic solvent | |
|---|---|---|---|---|---|---|---|---|
| | Type | Parts by mass | Type | Parts by mass | Type | Parts by mass | Type | Parts by mass |
| Dispersion liquid 21 | PR264 PY139 | 10.9 3.0 | Derivative 1 | 0.5 | P-1 | 20 | PGMEA | 79.3 |
| Dispersion liquid 22 | PB15:6 PV23 | 37.9 9.9 | Derivative 1 | 5.0 | P-1 | 20 | PGMEA | 360 |
| Dispersion liquid 23 | Titanium black | 25 | None | None | P-1 | 25 | PGMEA | 50 |
| Dispersion liquid 24 | PG36 PY185 | 10.3 2.6 | Derivative 1 | 1.6 | P-1 | 17 | PGMEA | 72 |
| Dispersion liquid 25 | PG36 PY185 | 9.1 3.6 | Derivative 1 | 1.7 | P-1 | 18 | PGMEA | 72 |
| Dispersion liquid 26 | PG58 PY185 | 10.3 2.6 | Derivative 1 | 1.6 | P-1 | 17 | PGMEA | 72 |
| Dispersion liquid 27 | PG58 PY185 | 9.1 3.6 | Derivative 1 | 1.7 | P-1 | 18 | PGMEA | 72 |
| Dispersion liquid 28 | PG36 PY150 | 10.3 2.6 | Derivative 1 | 1.6 | P-1 | 17 | PGMEA | 72 |
| Dispersion liquid 29 | PG36 PY150 | 9.1 3.6 | Derivative 1 | 1.7 | P-1 | 18 | PGMEA | 72 |
| Dispersion liquid 30 | Pc1 PY150 | 50 15 | Derivative 1 | 5.0 | P-1 | 20 | PGMEA | 360 |
| Dispersion liquid 31 | PP1 | 13.5 | None | None | P-1 | 13.3 | PGMEA | 82.5 |
| Dispersion liquid R1 | PR254 PY139 | 9.9 4.5 | Derivative 1 | 0.5 | PR-1 | 20 | PGMEA | 79.3 |
| Dispersion liquid R2 | PG36 PY185 | 9.1 3.6 | Derivative 2 | 1.7 | PR-2 | 18 | PGMEA | 72 |

TABLE 3-continued

| | Pigment | | Pigment derivative | | Dispersant | | Organic solvent | |
|---|---|---|---|---|---|---|---|---|
| | Type | Parts by mass | Type | Parts by mass | Type | Parts by mass | Type | Parts by mass |
| Dispersion liquid R3 | PG58 PY185 | 10.3 2.6 | Derivative 2 | 1.6 | PR-2 | 17 | PGMEA | 72 |
| Dispersion liquid R4 | PG36 PY150 | 9.1 3.6 | Derivative 2 | 1.7 | PR-2 | 18 | PGMEA | 72 |

The raw materials used for producing the dispersion Liquids 1 to 17, 21 to 31, and R1 to R4 are as follows.
(Pigment)
PR254: C. I. Pigment Red 254
PR264: C. I. Pigment Red 264
PY139: C. I. Pigment Yellow 139
PY150: C. I. Pigment Yellow 150
PY185: C. I. Pigment Yellow 185
PG36: C. I. Pigment Green 36
PG58: C. I. Pigment Green 58
PB15:6: C. I. Pigment Blue 15:6
PV23: C. I. Pigment Violet 23
Pc1: halogenated zinc phthalocyanine pigment described later
PP1: compound having the following structure

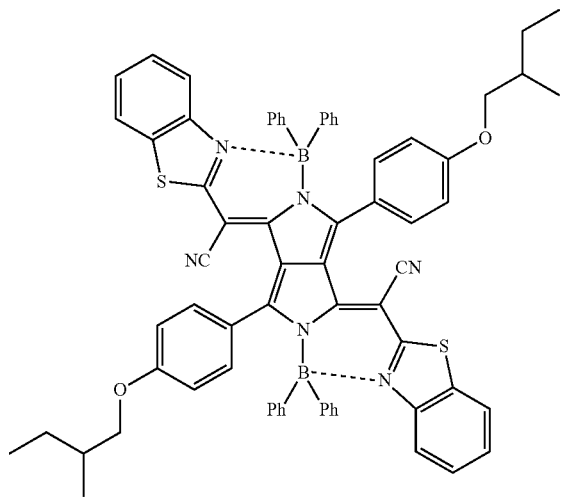

Titanium black: titanium black A-1 described later
Production of Halogenated Zinc Phthalocyanine Pigment Sulfuryl chloride (45.5 parts by mass), anhydrous aluminum chloride (54.5 parts by mass), and sodium chloride (7 parts by mass) were mixed at 40° C., and zinc phthalocyanine pigment (15 parts by mass) was added thereto. Bromine (35 parts by mass) was added dropwise thereto, and the mixture was heated to 130° C. over 19.5 hours and maintained for 1 hour. Thereafter, the reaction mixture was taken out into water to precipitate a crude halogenated zinc phthalocyanine pigment. The aqueous slurry was filtered, washed with hot water at 60° C., washed with 1% sodium hydrogen sulfate aqueous solution, washed with hot water at 60° C., and dried at 90° C. to obtain 2.7 parts by mass of a purified crude halogenated zinc phthalocyanine pigment A. The purified crude halogenated zinc phthalocyanine pigment A (1 part by mass), pulverized sodium chloride (10 parts by mass), and diethylene glycol (1 part by mass) were charged into a double-arm kneader and kneaded at 100° C. for 8 hours. After kneading, the mixture was taken out into water (100 parts by mass) at 80° C., stirred for 1 hour, filtered, washed with hot water, dried, and pulverized to obtain a halogenated zinc phthalocyanine pigment. From a mass spectrometry and a halogen content analysis by flask combustion and ion chromatograph, the average composition of the obtained halogenated zinc phthalocyanine pigment was $ZnPcBr_{9.8}Cl_{3.1}H_{3.1}$.

Pc is an abbreviation for phthalocyanine.

Production of Titanium Black A-1

100 g of titanium oxide MT-150A (trade name, manufactured by TAYCA CORPORATION) having an average primary particle size of 15 nm, 25 g of silica particles AEROSIL300 (trademark) 300/30 (manufactured by EVONIK) having Brunauer, Emmett, Teller (BET) specific surface area of 300 m²/g, and 100 g of Disperbyk 190 (trade name, manufactured by BYK Chemie were weighed, and these compounds were added to 71 g of ion-exchanged water to obtain a mixture. Thereafter, using MAZERSTAR KK-400W manufactured by KURABO, the mixture was stirred for 30 minutes at a revolution speed of 1360 rpm and a rotation speed of 1047 rpm to obtain a uniform mixture aqueous solution. The mixture aqueous solution was filled in a quartz container, and using a small rotary kiln (manufactured by MOTOYAMA Co., Ltd.), heated to 920° C. under an oxygen atmosphere. Thereafter, the atmosphere in the small rotary kiln was replaced with nitrogen, and by flowing ammonia gas at 100 mL/min for 5 hours at the same temperature, a nitrogen reduction treatment was performed. After finishing the nitrogen reduction treatment, the recovered powder was pulverized in a mortar, thereby obtaining a powdered titanium black (titanium black A-1) including Si atom and having a specific surface area of 73 m²/g.

(Pigment Derivative)

Derivative 1: Compound Having the Following Structure

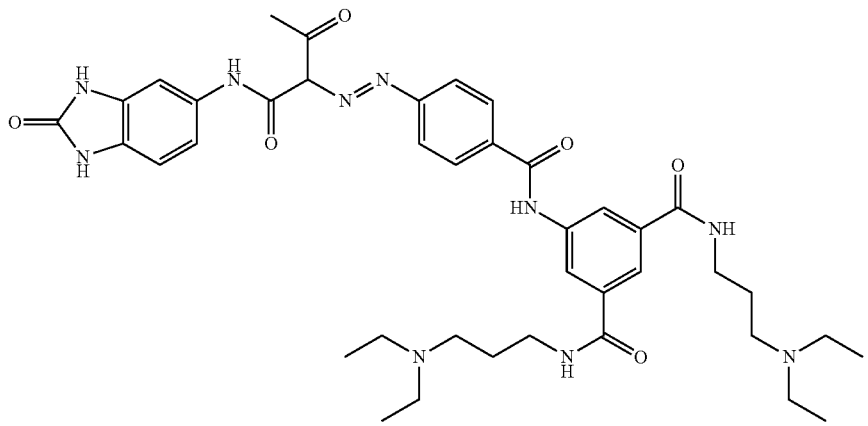 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Derivative 2: Compound Having the Following Structure

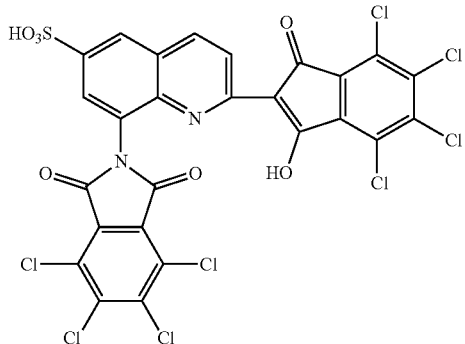 [SMILES: O=C1C(c2ccc3cc(S(=O)(=O)O)cc(N4C(=O)c5c(Cl)c(Cl)c(Cl)c(Cl)c5C4=O)c3n2)=C(O)c2c(Cl)c(Cl)c(Cl)c(Cl)c21]

(Dispersant)
P-1 to P-17: 30% by mass PGMEA solutions of P-1 to P-17 described above
PR-1: 30% by mass PGMEA solution of a resin having the following structure (numerical values added to the main chain represent molar ratio, and numerical values added to the side chain represent the number of repeating units; Mw=17,000, dispersity (Mw/Mn)=4.2, acid value=75 mgKOH/g, reduced viscosity=12.5 ml/g)

PR-2: 30% by mass PGMEA solution of SOLSPERSE 24000 (manufactured by Lubrizol Japan Ltd., basic polymer dispersant)
(Organic Solvent)
PGMEA: propylene glycol monomethyl ether acetate
(Dispersion Liquids 2-1 to 2-4)
With a beads mill (high pressure disperser equipped with a pressure-reducing system NANO-3000-10 (manufactured by Nippon BEE Chemical Co., Ltd.)) using 0.3 mm diameter of zirconia beads, a mixed liquid having composition shown in the following table was mixed and dispersed for 3 hours to prepare dispersion liquids 2-1 to 2-4. Table 4 shows the amounts (unit: parts by mass) of the corresponding components used. The numerical values of parts by mass of the dispersant in the following table are numerical values expressed in terms of solid contents.

TABLE 4

| | Pigment | | Dispersant | | Organic solvent | |
|---|---|---|---|---|---|---|
| | Type | Parts by mass | Type | Parts by mass | Type | Parts by mass |
| Dispersion liquid 2-1 | PR254 | 13.5 | PR-11<br>PR-12 | 2<br>2 | PGMEA | 82.5 |

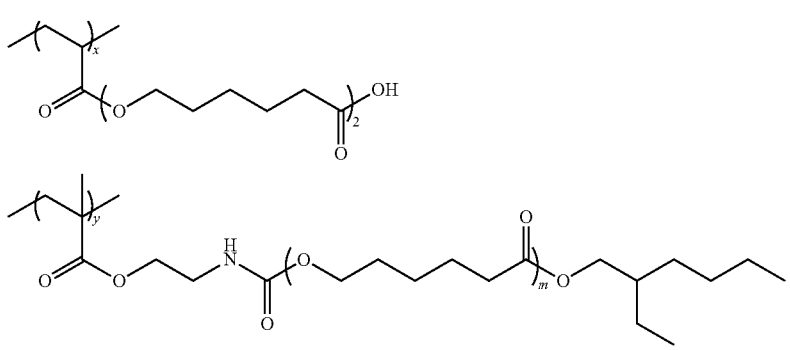

$x/y = 56.5/43.5$

TABLE 4-continued

| | Pigment | | Dispersant | | Organic solvent | |
|---|---|---|---|---|---|---|
| | Type | Parts by mass | Type | Parts by mass | Type | Parts by mass |
| Dispersion liquid 2-2 | PB15:6 | 13.5 | PR-13 | 4 | PGMEA | 82.5 |
| Dispersion liquid 2-3 | PY139 | 14.8 | P-1<br>PR-12 | 3<br>2.2 | PGMEA | 80 |
| Dispersion liquid 2-4 | PV23 | 14.8 | P-1<br>PR-12 | 3<br>2.2 | PGMEA | 80 |

The raw materials used for producing the dispersion liquids 2-1 to 2-4 are as follows.

(Pigment)
PR254: C. I. Pigment Red 254
PY139: C. I. Pigment Yellow 139
PB15:6: C. I. Pigment Blue 15:6
PV23: C. I. Pigment Violet 23

(Dispersant)
P-1: P-1 described above
PR-11: resin having the following structure (Mw: 7950)

In the following structural formula, subscripts in parentheses representing the constitutional unit of the polymer main chain indicate the content (% by mole) of the constitutional unit and subscripts in parentheses representing the polyester unit indicate the number of repetitions, respectively.

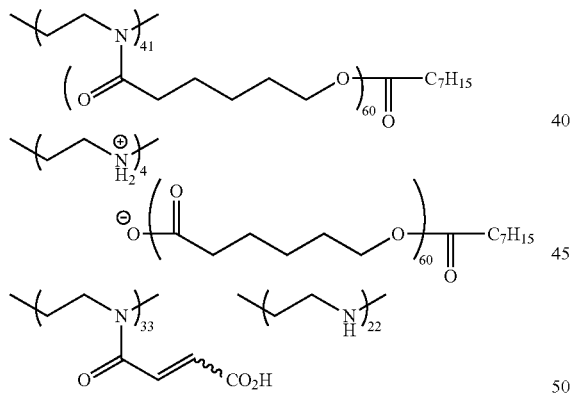

PR-12: resin having the following structure (Mw: 12000)

In the following structural formula, subscripts in parentheses representing the constitutional unit of the polymer main chain indicate the content (% by mole) of the constitutional unit.

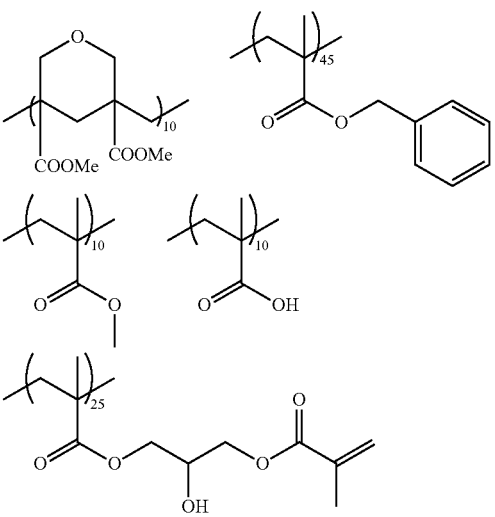

PR-13: resin having the following structure (Mw: 30000)

In the following structural formula, subscripts in parentheses representing the constitutional unit of the polymer main chain indicate the content (% by mole) of the constitutional unit and subscripts in parentheses representing the polyester unit indicate the number of repetitions, respectively.

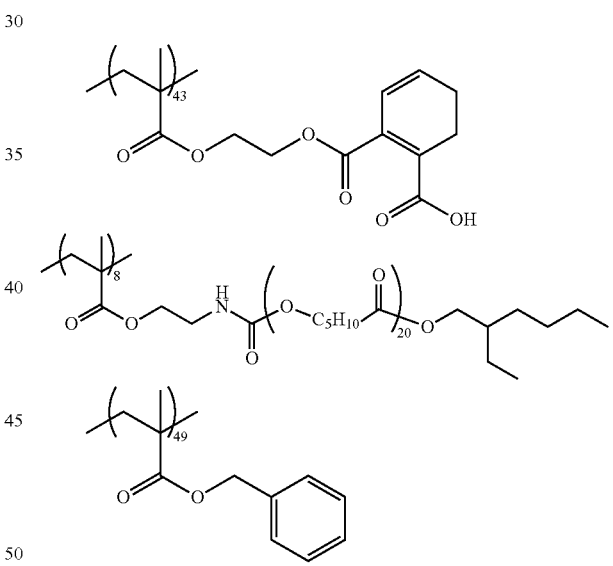

(Organic Solvent)
PGMEA: Propylene glycol monomethyl ether acetate

<Production of Composition>

The raw materials shown in the following table were mixed to produce compositions of Examples and Comparative Examples, respectively.

TABLE 5

| | | Dispersion liquid | | Resin | | Polymerizable monomer | | Photopolymerization initiator | | Organic solvent | |
|---|---|---|---|---|---|---|---|---|---|---|---|
| | | Type | Parts by mass | Type | Parts by mass | Type | Parts by mass | Type | Parts by mass | Type | Parts by mass |
| Example 1 | | Dispersion liquid 1 | 382 | D1 | 3 | E1 | 13 | F3 | 5 | PGMEA | 324 |

TABLE 5-continued

| | Dispersion liquid | | Resin | | Polymerizable monomer | | Photopolymerization initiator | | Organic solvent | |
|---|---|---|---|---|---|---|---|---|---|---|
| | Type | Parts by mass | Type | Parts by mass | Type | Parts by mass | Type | Parts by mass | Type | Parts by mass |
| Example 2 | Dispersion liquid 2 | 382 | D1 | 3 | E1 | 13 | F3 | 5 | PGMEA | 324 |
| Example 3 | Dispersion liquid 3 | 382 | D1 | 3 | E1 | 13 | F3 | 5 | PGMEA | 324 |
| Example 4 | Dispersion liquid 4 | 382 | D1 | 3 | E1 | 13 | F3 | 5 | PGMEA | 324 |
| Example 5 | Dispersion liquid 5 | 382 | D1 | 3 | E1 | 13 | F3 | 5 | PGMEA | 324 |
| Example 6 | Dispersion liquid 6 | 382 | D1 | 3 | E1 | 13 | F3 | 5 | PGMEA | 324 |
| Example 7 | Dispersion liquid 7 | 382 | D1 | 3 | E1 | 13 | F3 | 5 | PGMEA | 324 |
| Example 8 | Dispersion liquid 8 | 382 | D1 | 3 | E1 | 13 | F3 | 5 | PGMEA | 324 |
| Example 9 | Dispersion liquid 9 | 382 | D1 | 3 | E1 | 13 | F3 | 5 | PGMEA | 324 |
| Example 10 | Dispersion liquid 10 | 382 | D1 | 3 | E1 | 13 | F3 | 5 | PGMEA | 324 |
| Example 11 | Dispersion liquid 11 | 382 | D1 | 3 | E1 | 13 | F3 | 5 | PGMEA | 324 |
| Example 12 | Dispersion liquid 12 | 382 | D1 | 3 | E1 | 13 | F3 | 5 | PGMEA | 324 |
| Example 13 | Dispersion liquid 13 | 382 | D1 | 3 | E1 | 13 | F3 | 5 | PGMEA | 324 |
| Example 14 | Dispersion liquid 14 | 382 | D1 | 3 | E1 | 13 | F3 | 5 | PGMEA | 324 |
| Example 15 | Dispersion liquid 15 | 382 | D1 | 3 | E1 | 13 | F3 | 5 | PGMEA | 324 |
| Example 16 | Dispersion liquid 16 | 382 | D1 | 3 | E1 | 13 | F3 | 5 | PGMEA | 324 |
| Example 17 | Dispersion liquid 17 | 382 | D1 | 3 | E1 | 13 | F3 | 5 | PGMEA | 324 |
| Example 21 | Dispersion liquid 21 | 382 | D1 | 3 | E1 | 13 | F3 | 5 | PGMEA | 324 |
| Example 22 | Dispersion liquid 22 | 376 | D1 | 4 | E1 | 15 | F3 | 6 | PGMEA | 300 |
| Example 23 | Dispersion liquid 23 | 144 | D1 | 4 | E1 | 15 | F3 | 6 | PGMEA | 305 |
| Example 24 | Dispersion liquid 24 | 413.2 | D1 | 16.65 | E1 | 10.9 | F3 C7 | 1.1 3.2 | PGMEA | 131 |
| Example 25 | Dispersion liquid 25 | 414.8 | D1 | 15.9 | E1 | 10.9 | F3 C7 | 1.1 3.2 | PGMEA | 130 |
| Example 26 | Dispersion liquid 26 | 413.2 | D1 | 16.65 | E1 | 10.9 | F3 C7 | 1.1 3.2 | PGMEA | 131 |
| Example 27 | Dispersion liquid 27 | 414.8 | D1 | 15.9 | E1 | 10.9 | F3 C7 | 1.1 3.2 | PGMEA | 130 |
| Example 28 | Dispersion liquid 28 | 413.2 | D1 | 16.65 | E1 | 10.9 | F3 C7 | 1.1 3.2 | PGMEA | 131 |
| Example 29 | Dispersion liquid 29 | 414.8 | D1 | 15.9 | E1 | 10.9 | F3 C7 | 1.1 3.2 | PGMEA | 130 |
| Example 30 | Dispersion liquid 30 | 376 | D1 | 4 | E1 | 15 | F3 | 6 | PGMEA | 300 |
| Example 31 | Dispersion liquid 31 | 157 | D1 | 2.4 | E1 | 12 | F3 | 5 | PGMEA | 420 |
| | Dispersion liquid 2-1 | 63.5 | | | | | | | | |
| | Dispersion liquid 2-2 | 126.4 | | | | | | | | |
| | Dispersion liquid 2-3 | 57.8 | | | | | | | | |
| | Dispersion liquid 2-4 | 38.4 | | | | | | | | |
| Comparative Example 1 | Dispersion liquid R1 | 382 | D1 | 3 | E1 | 13 | F3 | 5 | PGMEA | 324 |
| Comparative Example 2 | Dispersion liquid R2 | 414.8 | D1 | 15.9 | E1 | 10.9 | F3 C7 | 1.1 3.2 | PGMEA | 130 |
| Comparative Example 3 | Dispersion liquid R3 | 413.2 | D1 | 16.65 | E1 | 10.9 | F3 C7 | 1.1 3.2 | PGMEA | 131 |
| Comparative Example 4 | Dispersion liquid R4 | 414.8 | D1 | 15.9 | E1 | 10.9 | F3 C7 | 1.1 3.2 | PGMEA | 130 |

The raw materials used for producing the compositions are as follows.

(Dispersion Liquid)

Dispersion liquids 1 to 17, 21 to 31, 2-1, 2-2, 2-3, 2-4, R1 to R4: dispersion liquids 1 to 17, 21 to 31, 2-1, 2-2, 2-3, 2-4, R1 to R4 described above (Resin)

D1: 40% by mass PGMEA solution of a resin having the following structure numerical values added to the main chain represent molar ratio; Mw=11,000

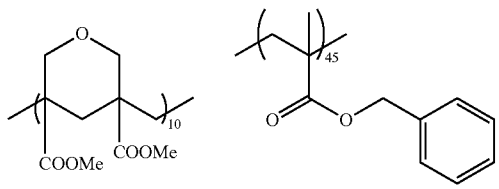

(D1)

(Polymerizable Monomer)

E1: KAYARAD DPHA (manufactured by Nippon Kayaku Co., Ltd.)

(Photopolymerization Initiator)

F3: compound having the following structure

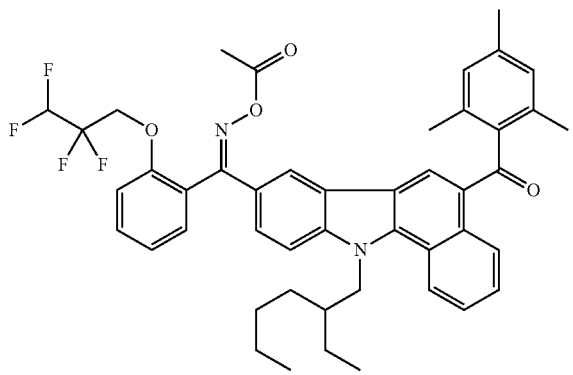 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

C7: compound having the following structure

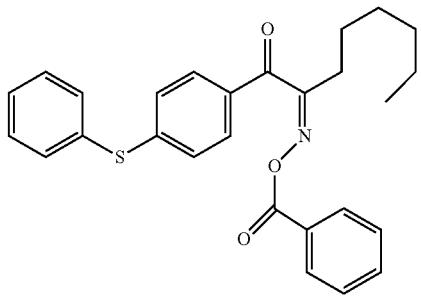 [SMILES: CCCCCC/C(=N/OC(=O)c1ccccc1)C(=O)c1ccc(Sc2ccccc2)cc1]

PGMEA: Propylene glycol monomethyl ether acetate

<Evaluation of Dispersion Stability>

The viscosity of each composition immediately after preparation was measured. Next, 10 g of each composition was sealed in a polypropylene jar, and the viscosity after being stored in a constant-temperature tank at 75° C. for 3 days was measured. Dispersion stability of the composition was evaluated by calculating a change in viscosity. The evaluation was performed according to the following standard.

As the change in viscosity, the thickening rate calculated by the following equation was used.

Thickening rate (%)=((Viscosity after being stored in a constant-temperature tank at 75° C. for 3 days−Viscosity immediately after preparation)/Viscosity immediately after preparation)×100

—Evaluation Standard—

A: thickening rate was 3% or less.

B: thickening rate was more than 3% and 5% or less.

C: thickening rate was more than 5% and 10% or less.

D: thickening rate was more than 10%. Alternatively, in a case of preparing the composition, the pigment could not be in a good dispersed state, and the viscosity could not be measured.

<Evaluation of Developability>

(Evaluation of Development Residue)

A cured film obtained with the minimum exposure amount such that the pattern line width after development was 1.0 μm or more was heated together with a glass substrate in an oven at 220° C. for 1 hour. After heating the cured film, the number of residues, on the glass substrate, in a region (unexposed area) not irradiated with light during the exposure step was observed using a scanning electron microscope (SEM) (magnification: 20000 times), and the development residue was evaluated. The evaluation was performed according to the following standard.

—Evaluation Standard—

A: no residue was observed in the unexposed area

B: 1 to 3 residues were observed in 1.0 μm square of the unexposed area

C: 4 to 10 residues were observed in 1.0 μm square of the unexposed area

D: 11 or more residues were observed in 1.0 μm square of the unexposed area (Evaluation of Undercut)

Each composition was spin-coated on a silicon wafer such that the film thickness after drying was 1.5 μm to form a coating film. The obtained coating film was placed on a hot plate with the silicon wafer facing down and was dried. The surface temperature of the hot plate was set to 100° C. and the drying time was set to 120 seconds.

Next, the dried coating film was exposed. The exposure was performed using an i-rays stepper (trade name "FPA- 3000iS+", manufactured by Canon Inc.). The coating film was irradiated (exposed) with an exposure amount of 400 mJ/cm$^2$ (irradiation time: 0.5 seconds) through a mask having a linear shape of 20 m (width 20 m, length 4 mm).

Next, the exposed film was subjected to a puddle development at 23° C. for 60 seconds using a 0.3% by mass of tetramethylammonium hydroxide (TMAH) aqueous solution for 5 times to obtain a film with pattern. Thereafter, the obtained film (film with pattern) was rinsed using a spin shower, and further washed with pure water.

Next, the obtained film (film with pattern) was heated at 220° C. for 300 seconds using a clean oven CLH-21CDH (manufactured by Koyo Thermo Systems Co., Ltd.). Furthermore, the heated film was placed on a hot plate having a surface temperature of 220° C. and heated for 300 seconds.

The heated film was captured with a scanning electron microscope, the undercut width (rpm) was measured, and the undercut was evaluated based on the following standard.

As the undercut width, as shown in FIG. 1, a length T of a notch at the bottom of a pattern edge portion 2 of the pattern formed on a silicon wafer 4 was measured. In FIG. 1, L$_1$ corresponds to an exposed region, and L$_2$ corresponds to an unexposed region. The evaluation was performed according to the following standard.

—Evaluation Standard—

A: undercut width was 0 μm or more and 0.25 μm or less.

B: undercut width was more than 0.25 μm and 0.5 μm or less.

C: undercut width was more than 0.5 μm and 1.0 μm or less.

D: undercut width was more than 1.0 m.

TABLE 6

| | | Developability | |
|---|---|---|---|
| | Dispersion stability | Development residue | Undercut |
| Example 1 | A | A | A |
| Example 2 | A | B | A |
| Example 3 | B | A | A |
| Example 4 | B | A | A |
| Example 5 | B | A | A |
| Example 6 | B | B | A |
| Example 7 | B | B | B |
| Example 8 | C | B | B |
| Example 9 | C | B | C |
| Example 10 | B | B | A |
| Example 11 | B | B | A |
| Example 12 | B | A | A |
| Example 13 | B | B | A |
| Example 14 | B | C | C |
| Example 15 | B | C | C |
| Example 16 | A | B | A |
| Example 17 | B | A | A |
| Comparative Example 1 | D | D | C |
| Comparative Example 2 | D | D | C |
| Comparative Example 3 | D | D | C |
| Comparative Example 4 | D | D | C |

As shown in the above table, Examples 1 to 17 have excellent dispersion stability of the pigment. In addition, in Examples 21 to 31, the same effects as in Example 1 are obtained.

In the composition of Example 1, instead of the dispersion liquid 1, even in a case where the half of the mass of P-1 used as a dispersant in the dispersion liquid 1 was replaced by DISPERBYK-161 (manufactured by BYK Chemie Japan), the same effects as in Example 1 were obtained.

In the composition of Example 1, even in a case where the photopolymerization initiator was changed to IRGACURE-369 (manufactured by BASF), the same effects as in Example 1 were obtained.

In the composition of Example 1, even in a case where the photopolymerization initiator was changed to a mixture (mass ratio of mixing was 1:1) of IRGACURE-369 (manufactured by BASF) and IRGACURE-OXE02 (manufactured by BASF), the same effects as in Example 1 were obtained.

EXPLANATION OF REFERENCES

2: pattern edge portion
4: silicon wafer
L$_1$: exposed region
L$_2$: unexposed region
T: length of notch (undercut width)

What is claimed is:

1. A composition comprising:
a compound represented by Formula (1); and
a pigment,

in Formula (1), R$^1$ represents an (m+n)-valent linking group,
P$^1$ represents a polymer chain which is represented by Formula (P1-1) and of which a weight-average molecular weight is 1000 or more,

in Formula (P1-1), A$^1$ represents a single bond or a divalent linking group, L$^1$ represents a polyether repeating unit, a polyester repeating unit, a polyamide repeating unit, a polyimide repeating unit, a polyimine repeating unit, or a polyurethane repeating unit, x represents a number of 2 or more, W$^1$ represents a hydrogen atom, or a substituent selected from the group consisting of an alkyl group, an aryl group, a heteroaryl group, an alkoxy group, an aryloxy group, a heteroaryloxy group, an alkylthioether group, an arylthioether group, a heteroarylthioether group, the substituent being unsubstituted or substituted with an additional substituent selected from the group consisting of an alkyl group, an aryl group, a heteroaryl group, an alkoxy group, an aryloxy group, a heteroaryloxy group, an alkythioether group, an arylthioether group, and a heteroarylthioether group, and a wavy line represents a linking hand, P$^2$ represents a polymer chain which is different from P$^1$ and has a repeating unit derived from a monomer having an ethylenically unsaturated bonding group in a main chain, m represents a number of 1 to 9, n represents a number of 1 to 9, and m+n satisfies 4 to 18, in a case where m is 2 or more, m P$^1$'s may be the same as or different from each other, and in a case where n is 2 or more, n P$^2$'s may be the same as or different from each other.

2. The composition according to claim 1,
wherein R$^1$ is a linking group derived from a polyfunctional thiol.

3. The composition according to claim 1,
wherein the compound represented by Formula (1) is a compound represented by Formula (2),

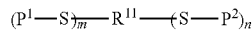 (2)

in Formula (2), $R^{11}$ represents an (m+n)-valent linking group,
$P^1$ represents a polymer chain which has, in a main chain, at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more,
$P^2$ represents a polymer chain which is different from $P^1$ and has a repeating unit derived from a monomer having an ethylenically unsaturated bonding group in a main chain,
S represents a sulfur atom,
m represents a number of 1 to 9, n represents a number of 1 to 9, and m+n satisfies 4 to 18,
in a case where m is 2 or more, m $P^1$'s may be the same as or different from each other, and
in a case where n is 2 or more, n $P^2$'s may be the same as or different from each other.

4. The composition according to claim 1,
wherein the weight-average molecular weight of the polymer chain represented by $P^1$ is 1000 to 10000.

5. The composition according to claim 1,
wherein the polymer chain represented by $P^1$ includes a polyester repeating unit in the main chain.

6. The composition according to claim 5,
wherein the polyester repeating unit includes a repeating unit derived from a lactone compound.

7. The composition according to claim 1,
wherein the polymer chain represented by $P^1$ has a repeating unit represented by Formula (G-1), Formula (G-2), or Formula (G-3) in the main chain,

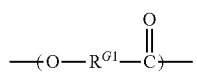 (G-1)

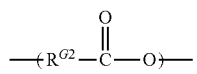 (G-2)

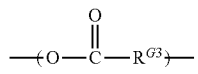 (G-3)

in the formulae, $R^{G1}$ to $R^{G3}$ respectively represent an alkylene group.

8. The composition according to claim 1,
wherein the polymer chain represented by $P^1$ is represented by Formula (P1-11), Formula (P1-12), or Formula (P1-13),

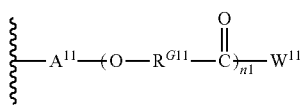 (P1-11)

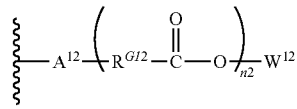 (P1-12)

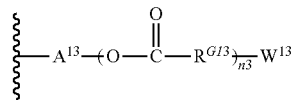 (P1-13)

in the formulae, $A^{11}$ to $A^{13}$ respectively represent a single bond or a divalent linking group, $R^{G11}$ to $R^{G13}$ respectively represent an alkylene group, n1 to n3 respectively represent a number of 2 or more, $W^{11}$ to $W^{13}$ respectively represent a hydrogen atom or a substituent, and a wavy line represents a linking hand,
n1 $R^{G11}$ may be the same as or different from each other,
n2 $R^{G12}$ may be the same as or different from each other, and
n3 $R^{G13}$ may be the same as or different from each other.

9. The composition according to claim 1,
wherein a molecular weight of the repeating unit derived from a monomer having an ethylenically unsaturated bonding group in the polymer chain represented by $P^2$ is 1000 or less.

10. The composition according to claim 1,
wherein the polymer chain represented by $P^2$ includes an acid group.

11. The composition according to claim 1,
wherein the polymer chain represented by $P^2$ includes an ethylenically unsaturated bonding group.

12. The composition according to claim 1,
wherein the repeating unit derived from a monomer having an ethylenically unsaturated bonding group in the polymer chain represented by $P^2$ is a repeating unit including a partial structure represented by Formula (P2-1),

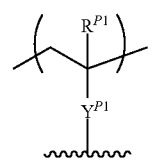 (P2-1)

in the formula, $R^{P1}$ represents a hydrogen atom or an alkyl group, $Y^{P1}$ represents a single bond, an aryl group, —COO—, or —CONN—, and a wavy line represents a linking site.

13. The composition according to claim 1,
wherein a weight-average molecular weight of the compound represented by Formula (1) is 4000 to 30000.

14. The composition according to claim 1,
wherein a dispersity of the compound represented by Formula (1) is 1.0 to 3.0.

15. The composition according to claim 1,
wherein an acid value of the compound represented by Formula (1) is 25 to 200 mgKOH/g.

16. The composition according to claim 1,
wherein the pigment is an organic pigment.

17. The composition according to claim 1,
wherein the pigment has a maximum absorption wavelength in a wavelength range of 400 to 2000 nm.

18. The composition according to claim 1, wherein the pigment has a maximum absorption wavelength in a wavelength range of 400 to 700 nm.

19. The composition according to claim 1, further comprising:
a polymerizable monomer.

20. The composition according to claim 1, further comprising:
a photopolymerization initiator.

21. A film obtained from the composition according to claim 1.

22. A color filter comprising the film according to claim 21.

23. A solid-state imaging element comprising the film according to claim 21.

24. An image display device comprising the film according to claim 21.

25. A method for producing a compound represented by Formula (1), the method comprising:
a step of reacting a polyfunctional thiol compound with a macromonomer which has at least one repeating unit selected from a polyether repeating unit, a polyester repeating unit, a polyamide repeating unit, a polyimide repeating unit, a polyimine repeating unit, or a polyurethane repeating unit, and of which a weight-average molecular weight is 1000 or more; and
a step of polymerizing a monomer having an ethylenically unsaturated bonding group in the presence of a reaction product obtained in the step of reacting,

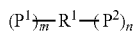
(1)

in Formula (1), $R^1$ represents an (m+n)-valent linking group,
$P^1$ represents a polymer chain which is represented by Formula (P1-1) and of which a weight-average molecular weight is 1000 or more,

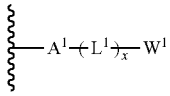
(P1-1)

in Formula (P1-1), $A^1$ represents a single bond or a divalent linking group, $L^1$ represents a polyether repeating unit, a polyester repeating unit, a polyamide repeating unit, a polyimide repeating unit, a polyimine repeating unit, or a polyurethane repeating unit, x represents a number of 2 or more, $W^1$ represents a hydrogen atom, or a substituent selected from the group consisting of an alkyl group, an aryl group, a heteroaryl group, an alkoxy group, an aryloxy group, a heteroaryloxy group, an alkylthioether group, an arylthioether group, a heteroarylthioether group, the substituent being unsubstituted or substituted with an additional substituent selected from the group consisting of an alkyl group, an aryl group, a heteroaryl group, an alkoxy group, an aryloxy group, a heteroaryloxy group, an alkylthioether group, an arylthioether group, and a heteroarylthioether group, and a wavy line represents a linking hand, $P^2$ represents a polymer chain which is different from $P^1$ and has a repeating unit derived from a monomer having an ethylenically unsaturated bonding group in a main chain, m represents a number of 1 to 9, n represents a number of 1 to 9, and m+n satisfies 4 to 18, in a case where m is 2 or more, m $P^1$'s may be the same as or different from each other, and in a case where n is 2 or more, n $P^2$'s may be the same as or different from each other.

26. The composition according to claim 1, wherein the repeating unit derived from a monomer having an ethylenically unsaturated bonding group in the polymer chain represented by $P^2$ is a repeating unit including a partial structure represented by Formula (P2-1-1)

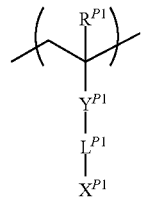
(P2-1-1)

in Formula (P2-1-1), $R^{P1}$ represents a hydrogen atom or an alkyl group, $Y^{P1}$ represents an aryl group, —COO—, or —CONH—, $L^{P1}$ represents a single bond or a divalent linking group, and $X^{P1}$ represents an acidic group.

27. The method according to claim 25, wherein the repeating unit derived from a monomer having an ethylenically unsaturated bonding group in the polymer chain represented by $P^2$ is a repeating unit including a partial structure represented by Formula (P2-1-1)

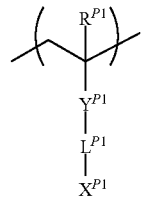
(P2-1-1)

in Formula (P2-1-1), $R^{P1}$ represents a hydrogen atom or an alkyl group, $Y^{P1}$ represents an aryl group, —COO—, or —CONH—, $L^{P1}$ represents a single bond or a divalent linking group, and $X^{P1}$ represents an acidic group.

* * * * *